United States Patent [19]
Matsushita

[11] 4,113,353
[45] Sep. 12, 1978

[54] INFORMATION PROCESSING OPTICAL DEVICE

[76] Inventor: Akira Matsushita, Kawasaki, Japan

[21] Appl. No.: 746,830

[22] Filed: Dec. 2, 1976

Related U.S. Application Data

[63] Continuation of Ser. No. 495,491, Aug. 7, 1974, abandoned.

[30] Foreign Application Priority Data

Apr. 20, 1974 [JP] Japan ................................. 49-43908
Apr. 20, 1974 [JP] Japan ................................. 49-43909

[51] Int. Cl.² ............................................. G02B 27/14
[52] U.S. Cl. ................................. 350/171; 235/92 V; 250/227; 340/146.3 F; 350/96.10
[58] Field of Search ............... 250/208, 209, 216, 227, 250/567, 578; 350/96 R, 96 B, 96 WG, 169, 171; 340/146.3 F, 146.3 MA; 235/92 V, 92 ME

[56] References Cited

U.S. PATENT DOCUMENTS

| | | | |
|---|---|---|---|
| 2,881,976 | 4/1959 | Greanias | 350/96 R X |
| 3,109,065 | 10/1963 | McNaney | 250/227 X |
| 3,177,470 | 4/1965 | Galopin | 340/146.3 F |
| 3,191,049 | 6/1965 | McNaney | 250/227 |
| 3,412,255 | 11/1968 | Krieger | 250/227 |

*Primary Examiner*—Eugene R. LaRoche
*Attorney, Agent, or Firm*—Robert E. Burns; Emmanuel J. Lobato; Bruce L. Adams

[57] ABSTRACT

An optical device is employed for information processing operations such as pattern recognition, image display and information storage. The optical device comprises a body in which a number of spot-like transparent sections are arranged in the form of a matrix on a main surface thereof or a number of linear transparent sections are arranged in parallel to one another on the same, a plurality of transparent sections being arranged on the end surface thereof in correspondence to the lines and/or the columns of the above-described transparent section, and beam introducing paths, namely, beam guide means, such as optical fibers, which are provided in the body, for optically connecting the transparent sections on the main surface to the respective ones on the end surface. This optical device is utilized in such a manner that photosensitive elements or luminous elements are connected directly to the transparent sections on the end surface or are connected through an optical encoder or an optical decoder indirectly to the same.

4 Claims, 75 Drawing Figures

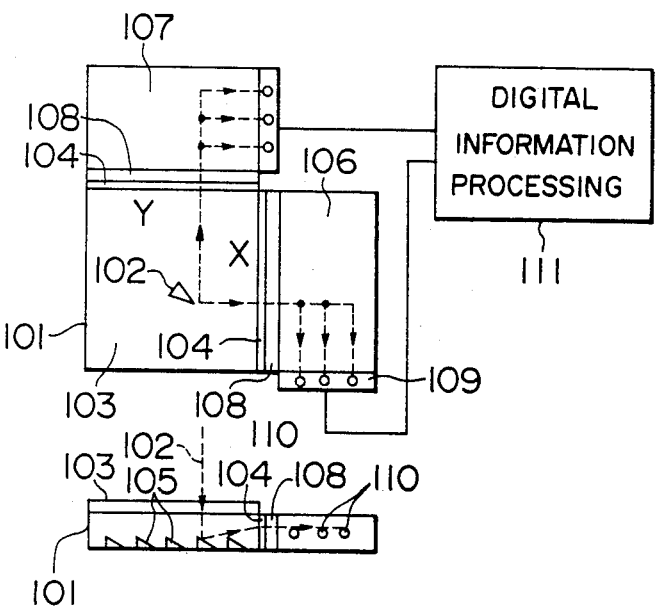
FIG. 11(a)
FIG. 11(b)
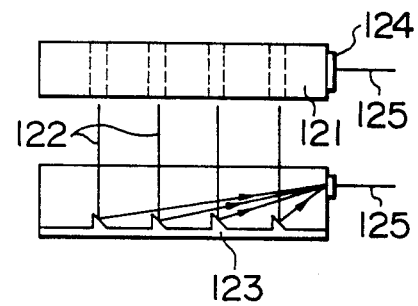
FIG. 12(a)
FIG. 12(b)
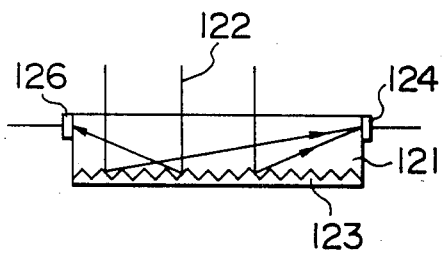
FIG. 13
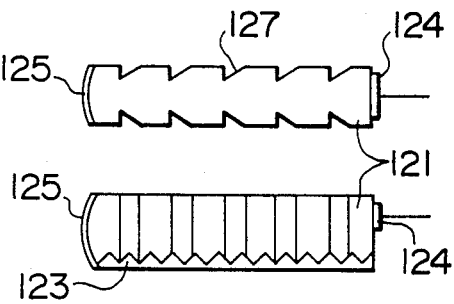
FIG. 14(a)
FIG. 14(b)

FIG. 15
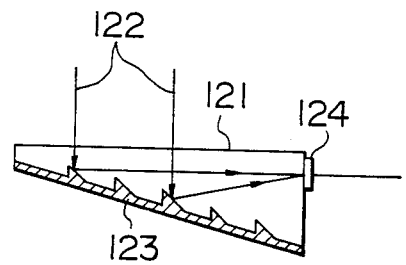
FIG. 16(a)   FIG. 16(b)   FIG. 16(c)
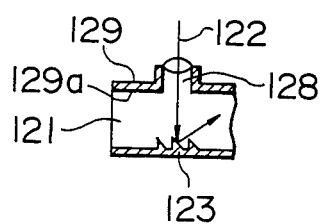 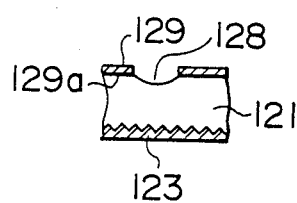 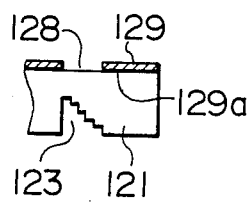
FIG. 17
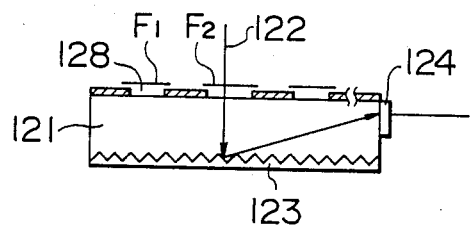
FIG. 18
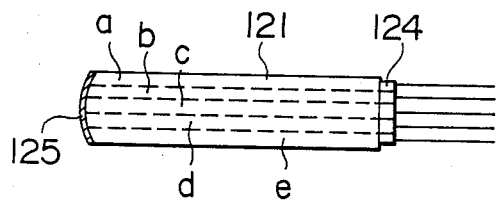

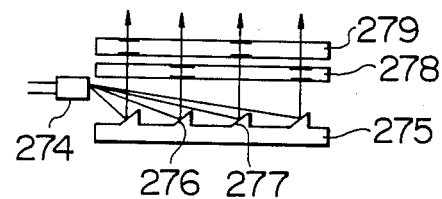
FIG. 39
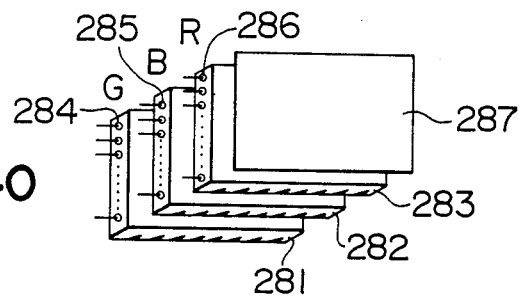
FIG. 40
FIG. 41(a)  FIG. 41(b)
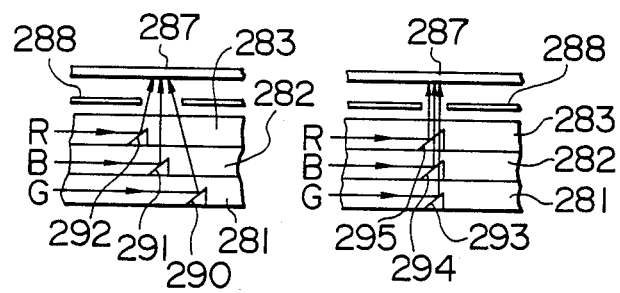
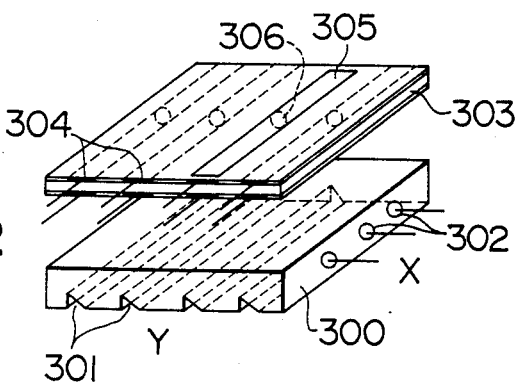
FIG. 42

FIG. 61(b)
FIG. 61(a)
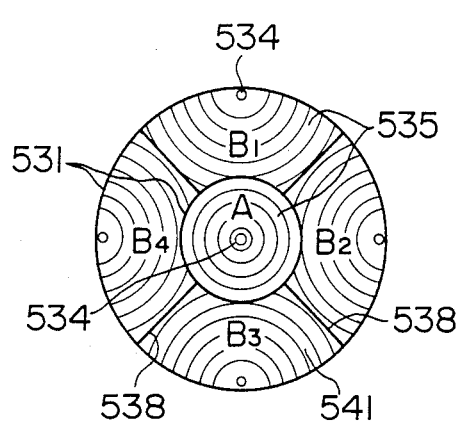
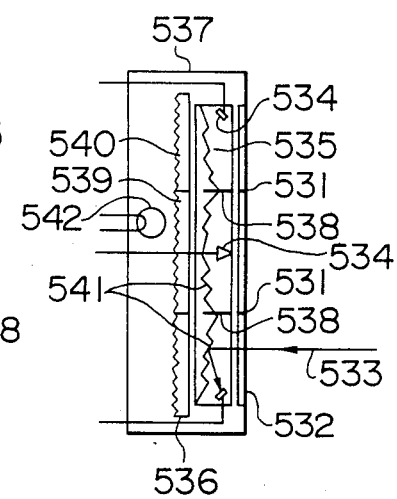
FIG. 62
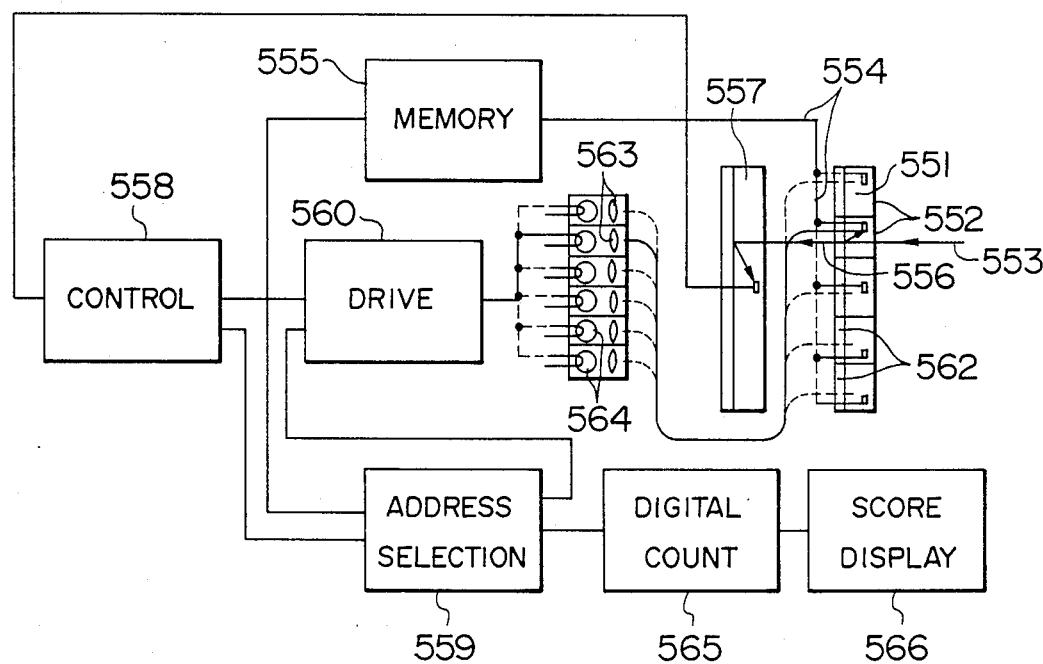

INFORMATION PROCESSING OPTICAL DEVICE

This is a continuation of application Ser. No. 495,491, filed Aug. 7, 1974, now abandoned.

BACKGROUND OF THE INVENTION

This invention relates to panel type optical devices suitable for information processing such as pattern recognition, image display and information storage, and more particularly to panel type optical devices in which light is emitted from or received by its panel surface and electro-optical conversion or photo-electric conversion is carried out at the end surface thereof.

Image detectors or photoelectric converters are known in the art, in which a number of photo-transistors or photosensitive elements are arranged in the form of a matrix or a line in a plane. In addition, image detectors or electricity-to-light converters (hereinafter referred to as electro-optical converters when applicable) in which luminescent elements such as electroluminescent diodes are arranged in the form of a matrix or a line in a plane are also known in the art. Furthermore, a method of optically connecting optical guide means such as mirrors and optical fibers to the photosensitive elements or luminescent elements is known.

However, these conventional photoelectric converters or electro-optical converter are disadvantageous in the following respects. A large number of photosensitive elements or luminescent elements are necessary for improving the resolution of these conventional converters, as a result of which the converter is intricate in construction, high in manufacturing cost and low in reliability.

Furthermore, in the conventional devices, an electrical peripheral device for addressing a number of photoelectric elements or electro-optical elements arranged on the beam receiving surface or the beam emitting surface thereof becomes intricate with the increase in number of them. Accordingly, electro-optical devices such as image detecting devices, image reading devices and image displaying devices which employ the conventional photoelectric or electro-optical converters are not always satisfactory in resolution, reliability, stability and cost. In other words, it counteracts against the constructional simplification, low cost, high stability and high reliability of the electro-optical device to increase the number of the conversion elements for improving the function thereof such as the resolution and making the display surface larger, that is, there is a limit in the improvement of the conventional electro-optical devices.

The improvement which has been done in this art, as is found in the conventional electro-optical devices having the integrated circuits of electroluminescent diodes or photo-transistors, is directed to the reduction of the number of purely optical parts therein and to the rationalization of electrical peripheral circuits for processing various information. As a result, in the electro-optical device employing the conventional photoelectric converters or the conventional electro-optical converters for the purpose of information processing, practically the improvement of resolution, the increase of an image size, the increase of information quantity to be processed and the like reach the limit.

BRIEF SUMMARY OF THE INVENTION

Accordingly, a primary object of this invention is to overcome the above-mentioned difficulties accompanying the conventional optical devices, and more specifically to provide a special and novel information processing optical device which has a simple structure for improving resolution, increasing an image size and increasing information quantity.

Another object of the invention is to provide an information processing optical device which is effective in simplifying the construction of its electrical peripheral circuits.

A further object of the invention is to provide a fundamental system concept which is necessary for applying the information processing optical device described above to pattern recognition, and display, transmission or memory of a mono-color or multi-color image, and the like.

According to an aspect of this invention in view of these objects, provided is an information processing optical devices which comprises a body in which a number of spot-like transparent sections are arranged in the form of a matrix on a main surface thereof, a plurality of transparent sections being arranged on the end surface thereof in correspondence to the lines and columns of the former transparent sections, and optical guide means provided in the body, for optically connecting the former transparent sections on the main surface to the respective latter transparent sections on the end surface, the optical device being effectively utilized as an electro-optical converter for image display or a photoelectric converter for pattern recognition by optically connecting luminescent elements, or beam receiving elements, to the transparent sections on the end surface.

According to another object of this invention, an information processing optical device is provided which comprises a flat body in which a number of linear transparent sections are arranged in parallel to one another on a main surface thereof, a plurality of transparent sections being disposed on an end surface thereof in correspondence to the lines of the linear transparent sections, and optical guide means provided in the flat body, for optically connecting the linear transparent sections to the transparent sections on the end surface, whereby the optical device can be utilized as an electro-optical converter or a photoelectric converter such as that described above.

The optical guide means can be made up of, for instance, mirrors or optical fibers, while the flat body may be formed with transparent or non-transparent materials such as various glass or plastic materials or the combination of these material and other materials.

According to this invention, it is proposed to form an optical encoder or an optical decoder by providing OR logic circuits or AND ones by the use of a number of beam paths obtained by the beam guide means and properly combining these logic circuits. The combination of the optical encoder and the optical decoder thus formed and the optical device described above contributes to the simplification of the electric peripheral circuit of the optical device.

The foregoing objects and other objects of this invention will become more apparent from the following detailed description when read in conjunction with the accompanying drawings.

BRIEF DESCRIPTION OF THE DRAWINGS

In the accompanying drawings:

FIGS. 11(a) and (b) are plan and sectional views, respectively, illustrating a device for detecting a beam incident point which employs the optical encoder according to the invention;

FIGS. 12(a) and (b) through 16(a) - (c) are diagrams illustrating modifications of beam guide means;

FIG. 17 is a sectional view showing an optical device provided with an optical filter;

FIG. 18 is a top view of an optical device having linear beam input sections;

FIG. 39 is a sectional views illustrating a modification of shutter means;

FIG. 40 is a perspective view for describing the principle of a color display device;

FIGS. 41(a) and (b) are sectional views illustrating the internal construction of a color display device;

FIG. 42 is a perspective view illustrating another example of the image display device according to the invention;

FIGS. 61(a) and (b) are sectional and plan views, respectively, illustrating another example of the photoelectric transducer employed as a target according to the invention; and FIG. 62 is a block diagram showing a target system utilizing the photoelectric transducer employed for a target according to the invention.

DETAILED DESCRIPTION OF THE INVENTION

Aspect I

Figure 1:
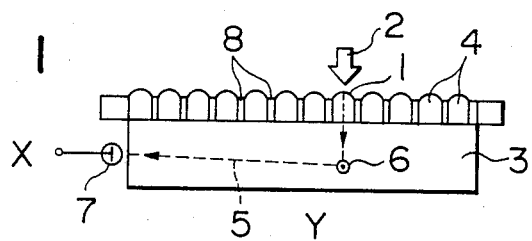
FIG. 1 is a schematic sectional view illustrating the principle of a matrix type optical device according to this invention.

A first aspect of this invention relates to a pattern recognition device which essentially comprises a light beam generator and a beam receiving device for receiving beams emitted from the light beam generator.

Various pattern recognition devices are known in the art. In most of these conventional pattern recognition devices, ultrasonic waves, electromagnetic induction, light or electromagnetic waves are employed as an input signal to be applied thereto, and the input signal is converted into an electrical signal through a transducer.

In the pattern recognition device where the ultrasonic wave is employed as the input signal, a system of converting an acoustic wave caught by, or applied to, a transducer on the peripheral portion of its signal receiving board into an electrical signal is often employed. Accordingly, this method is disadvantageous in that the operating speed and resolution are limited and noises are caused.

In the pattern recognition device employing an electromagnetic input signal, it is necessary to provide a matrix-type wiring network on the signal receiving board. Accordingly, this device is also disadvantageous in that a magnetic interference is caused between adjacent bits which will become apparent later, and an information density and an S/N ratio are inevitably limited.

Heretofore, pattern recognition devices employing optical methods have been used in various ways. A conventional pattern recognition device employing a laser hologram is superior in resolution. However, the pattern recognition device of the type that a light pen for applying an input signal to a hologram plate and an input section for indicating addresses manually are coupled by a link mechanism, is of the indirect address indicating device, and is accordingly intricate in construction and also in operation.

In addition, there is known in the art a graphical method in which positions are recognized by placing a light pen on a pattern displayed on a cold cathode ray tube, and a method in which a beam receiving array obtained by arranging beam receiving elements in the form of a matrix with high concentration recognizes and processes optical input information directly. However, these methods are still disadvantageous in that the devices employing these method are intricate in construction and accordingly high in cost, and the size of a beam receiving surface is limited. Accordingly, the conventional devices must be improved before employing them as general purpose terminal units.

In an example of this invention, a beam signal emitted from a signal generator is applied to a beam receiving surface, and the positional coordinates of this beam signal thus applied is recognized by transducers provided at the ends of beam paths in the form of a matrix. According to this example, provided is a pattern recognition device in which a predetermined information pattern is drawn on a recording sheet on a beam receiving surface by using color ink which is capable of transmitting an incident wavelength, whereby the locus of an incident beam signal can be recognized visually or a pattern recognition device in which different characters are assigned to different positions on the beam receiving surface and a character board or a character sheet printed with the ink mentioned above is provided so that a beam applied from above a character selected is utilized as a character encoding input.

In the first example of this invention, the input signals received by the device are transferred and processed by a peripheral circuit such as a memory device, a read-only memory or a retrieval circuit thereby being utilized to reproduce and display a pattern input as desired.

The principle of the first aspect of this invention will be concretely described with reference to FIG. 1.

In the device shown in FIG. 1, a light beam 2 (indicated by a white arrow mark) is applied to a part corresponding to a bit on a beam receiving surface 1, and the beam 2 thus applied reaches a beam conducting body 3, or an optical conductor through a transparent section 4 which is adapted to correct the direction of the beam 2 to be perpendicular to the beam receiving surface 1. The body 3 causes the incident beam to branch at the incident point into a signal 5 in the direction X and a signal 6 in the direction Y, and serves as a light beam conducting path, or a beam path, to transmit these branch signals to photo-electric transducers 7, respectively. The beam receiving surface may be in the form of the Fresnel lens or flat, as well as in the form of an optical lens as indicated in FIG. 1, for every bit.

Figure 2:
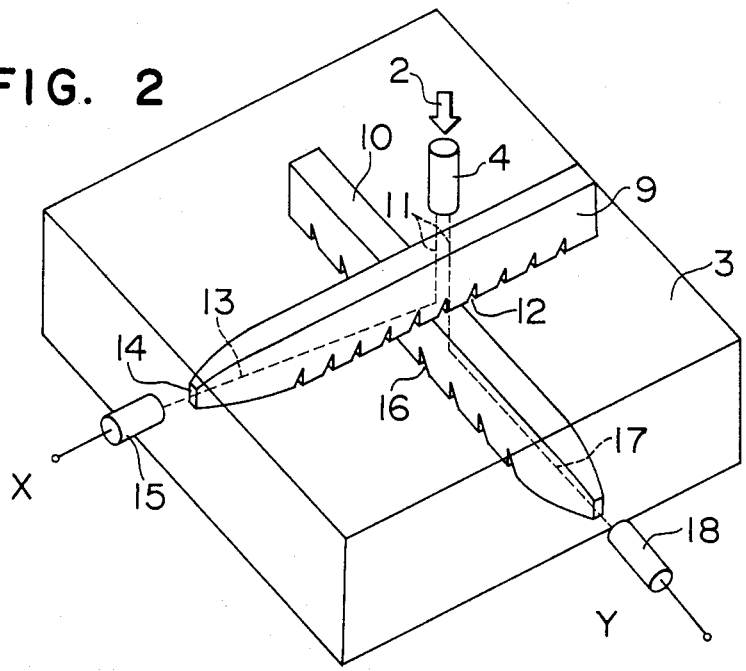
FIGS. 2 and 3 are perspective views for theoretically illustrating beam paths per bit in the optical device in FIG. 1.
Figure 3:
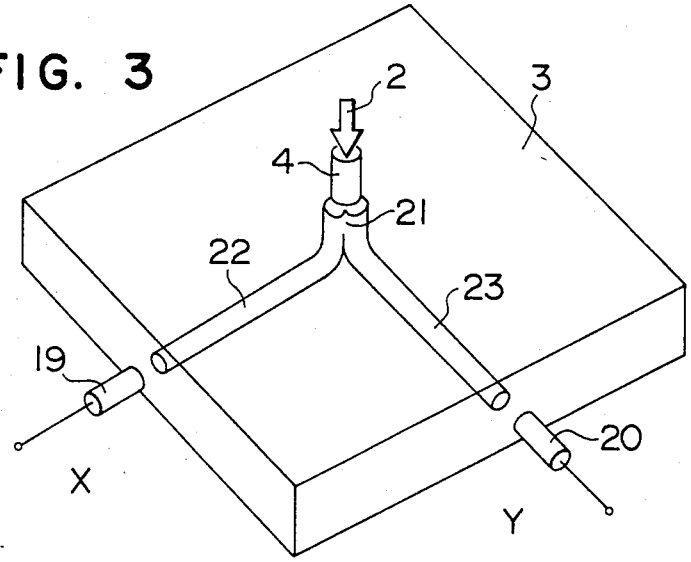

The constructional principle of one bit of the body 3 is illustrated in FIGS. 2 and 3.

In FIG. 2, the beam 2 from a beam generating device enters beam paths 9 and 10 through the transparent section 4. A part 13, or a beam 13, of the beam signal 11 is deflected in the direction X by one of the beam reflecting surfaces 12 which are provided at the lower part of the beam path 9 at the intervals of one bit. The beam 13 is applied to an output transducer 15 through a beam focusing surface 14. Another part 17 of the beam signal 11 is transmitted through the beam path 9 to a beam reflecting surface 16 of the beam path 10, where it is deflected in the direction Y, that is, this part of the beam signal 11 becomes a branch beam 17 and is applied to a transducer 18 provided on the side Y of the body 3. The beam paths 9 and 10 may be either in the form of a round bar or in the form of a relatively flat rectangular parallelopiped.

Basing on the principle described above, there are provided a number of beam receiving bits in the form of a matrix on the beam receiving surface, and a number of transducers on the sides of the body 3, so that the positional coordinates of an incident beam is electrically recognized.

A device shown in FIG. 3 is also to detect the positional coordinates of an incident beam 2 by output transducers 19 and 20. From a beam receiving part 21 representing one bit, at least two beam conducting lines 22 and 23 made of optical fibers are extended, as beam paths, in the directions X and Y, respectively. These branch beam conducting paths 22 and 23 are provided for every bit. All of the branch beam conducting paths in the direction X are bundled together at their ends, and at least one transducer is connected to each of the ends thus bundled, while all of the branch beam conducting paths in the direction Y are also treated in the same way, thereby to form a matrix-type optical conductor device which can recognize the position of an incident light beam.

Signals emitted from a beam signal generator may be visible or invisible beams such as electromagnetic waves, electron beams, ultraviolet rays or infrared rays.

However, a coherent signal having a narrow wavelength band is more effective in the embodiment this invention. It can be determined according to the objects in use of the device whether the signal should be emitted continuously or intermittently from the beam signal generator.

The sectional shape of the emission beam may be any of the configurations such as a triangle, a rectangle and a circle, which is applied to one or a plurality of bits on the beam receiving surface.

The emission end of the beam signal generator may be directly in contact with the beam receiving surface or may be set apart therefrom.

The construction and the material of the beam path are determined according to the wavelength of a signal to be processed.

Figure 4A:
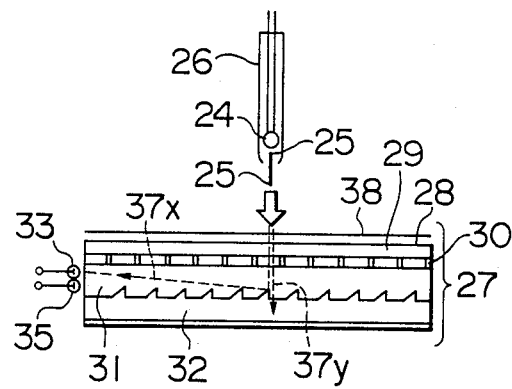
FIGS. 4(a) and (b) are sectional and plan views illustrating a pattern recognition device employing the matrix type optical device according to the invention, respectively.
Figure 4B:
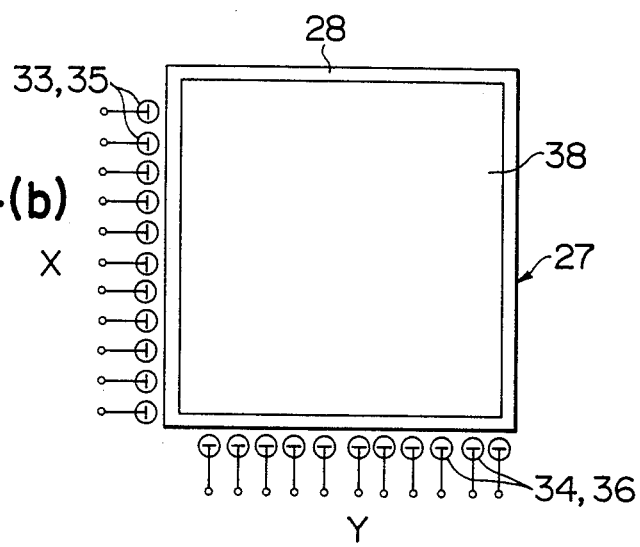

FIG. 4 illustrates a pattern recognition device for providing two kinds of input information. This device comprises an input pen 26 oprating as a beam signal generator. The input pen 26 comprises a light source 24 which emits an infrared laser beam capable of having one of two wavelengths in accordance with instructions, and a pen 25 which is provided at the end of the light beam signal generator 26 and includes an infrared ray transmissive ink for writing characters.

An input information receiving device 27 comprises a support plate 29 which when the end of the input pen 26 comes in contact with a beam receiving surface 28, introduces a beam-shaped optical signal into the device, a transparent sections 30 for introducing a light beam into the device in a direction substantially perpendicular to the beam receiving surface 28, and first and second optical conductor layers 31 and 32 which will be described later.

There is provided a convex or concave lens or a Fresnel lens for every bit at the interface between the support plate 29 and the transparent section 30. The thickness of the support plate 29 is corresponding to the focal distance of the lens system. In addition, if the transparent section is formed in such a manner that thin cylindrical optical fibers having a great refractive index are bundled together thereby to form a beam path for one bit and are disposed perpendicular to the beam receiving surface 28, and a focusing lens is provided at the outlet of the bundled optical fibers, it is effective in forming incident beams including many parallel beams.

The first optical conductor layer 31 is formed by disposing X lines of beam paths 9 as shown in FIG. 2 and interposing light shielding spacers therebetween in one plane. There is provided a beam reflective section on the lower part of the layer 31 so as to deflect an incident beam in the direction X for every bit. Similarly as in the first layer 31, the second optical conductor layer 32 is formed by disposing Y lines of beam paths 10 as shown in FIG. 2 and by interposing light shielding spacer therebetween. The first layer 31 and the second layer 32 are in contact with each other in such a manner that the longitudinal directions of their beam paths are perpendicular to each other.

The light source 24 which emit two beams of different wavelengths, respectively, is a main light source for write only, beams from which are detected by photoelectric elements 33 and 34 provided along the sides of a beam receiving matrix in the input information receiving device. The other light source is an auxiliary light source for erase only, beams from which are detected by photoelectric elements 35 and 36. The beams thus detected are processed by an electronic peripheral unit.

in the device according to this invention, a light transmissive recording sheet 38 is placed on the beam receiving surface 28, and characters or figures are drawn with the input pen 26 thereon. In this operation, branch beams 37$x$ and 37$y$ separated from the beam emitted by the main light source are directed to the photoelectric element 33 in a line $x$ and the photoelectric element 34 in a column $Y$, respectively. Accordingly if the photoelectric elements to which the input beam has been introduced are retrieved by a peripheral electric circuit, the positional coordinates of the input beam can be detected. In the case where it is necessary to amend or erase the information which has been erroneously applied, the auxiliary light source having a wavelength different from that of the main light source is operated to apply a light beam in the same manner as described above. As a result, the information on the coordinates erroneously written can be electrically erased by command signals from the photoelectric elements 35 and 36.

Figure 5A:
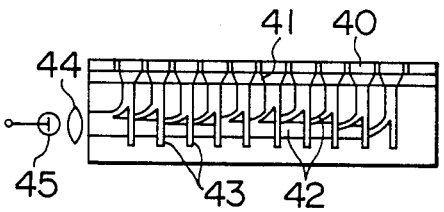
FIGS. 5(a) and (b) are sectional and plan views showing a matrix type optical device according to this invention, respectively.
Figure 5B:
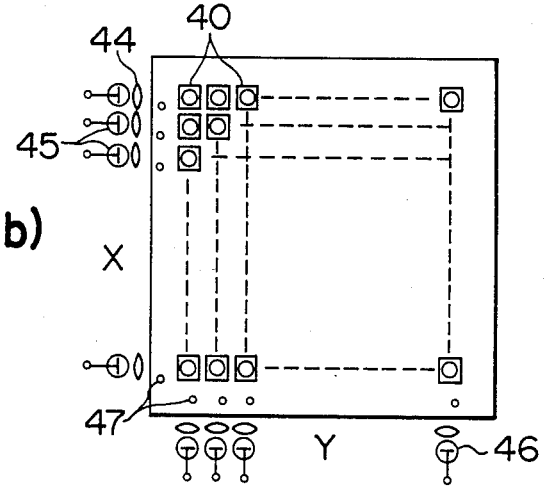

Another example of the input information receiving device according to this invention is illustrated in FIG. 5, which comprises a beam receiving surface 40 in the form of a matrix and a transparent sections 41. From each bit in the transparent section, a two-conductor type beam path is extended which is formed by connecting one ends of two optical glass fibers 42 and 43 together as shown in FIG. 5($a$). The other end of the glass fiber 42 are extended as beam paths in the direction of the lines $x$, while the other ends of the glass fibers 43 are extended as beam conducting paths in the direction of the columns Y. In each of the rows X (or the columns Y) the ends of the beam paths are bundled together at a beam receiving end, and photoelectric elements 45 (or 46) are optically coupled with the ends of the beam paths thus bundled, respectively.

The position of a beam spot applied to the beam receiving surface 40 can be represented as coordinates by detecting which photoelectric elements have received the beam, in the same manner as described with reference to FIG. 4. The device further comprises pilot lamps 47 for confirming the reception of a beam.

If a comb-shaped block obtained by forming the beam paths for every line or column is molded and the comb-shaped block thus molded are assembled properly, the complete whole beam conducting paths can be formed readily. Accordingly, the device shown in FIG. 5 is suitable for mass production.

Figure 6:
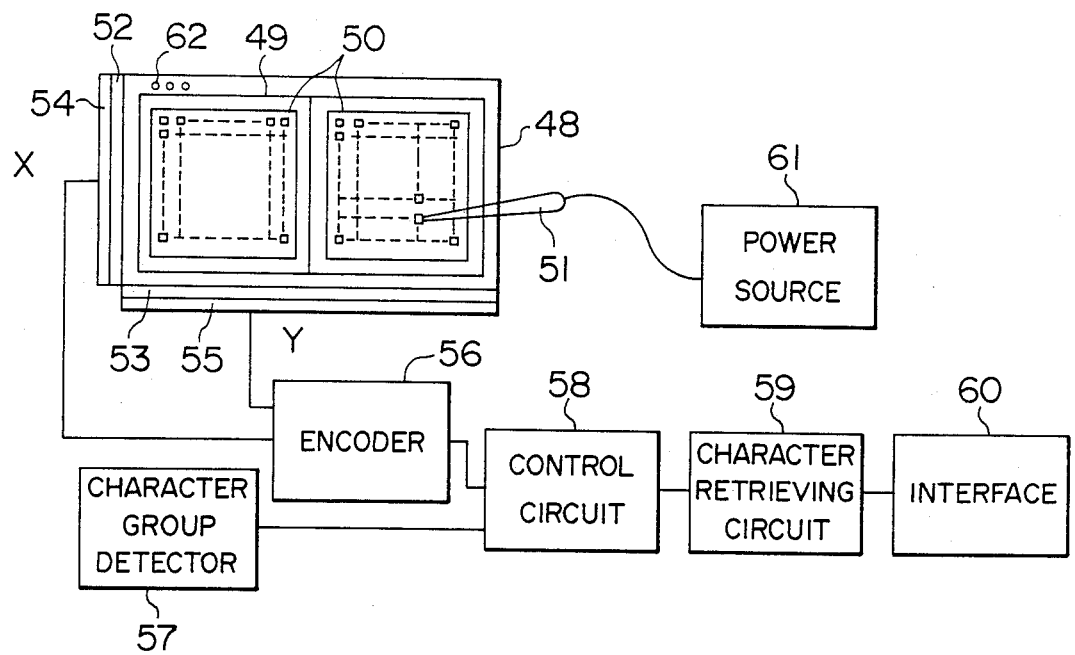
FIG. 6 is a block diagram illustrating a "kanji (Chinese character)" input device employing a matrix type optical device according to the invention.

Shown in FIG. 6 is one example of a "kanji (Chinese character)" input device to which this invention is applied, in which there is provided a character board 48 on the beam receiving surface of the device according to the invention. The character board 48 comprises a character selection region 49 consisting of two groups of characters 50. More specifically, the character selection region 49 is divided into a number of squares such as for instance found in a checkerboard. The characters are assigned in the squares, or bits, respectively, and are printed in color ink which is transmissive with respect to the wavelength of a beam from a light pen 51. When the beam from the light pen 51 is applied to a character visually selected, the beam is received by one of the grouped beam receiving elements 52 and also by one of the grouped beam receiving elements 53 and retrieved by selective scanning circuits 54 and 55, and encoded by an encoder 56 into an address code signal of the character. This code signal and a signal from a character group detector 57 drive a control circuit 58, so that the address code signal is converted into a character code.

If a character retrieving circuit 59 constituted by memory elements is connected to an interface unit for applying input data to a character reproduction display device or an information processing device, a Chinese character input device simple in construction and operation can be readily obtained. In FIG. 6, reference 61 is a power source of the light pen 51, and reference 62 represents pilot lamps for confirming the selection of characters. In the example described above, it is not always necessary for the printed characters to be light-transmissive.

In the description above, the shape of beam receiving surface is a rectangle, however, it may be other than the rectangle. In addition, if a number of beam receiving surfaces shown in FIG. 6 are connected in parallel to or in series to one another, the quantity of information can be readily increased.

In the pattern recognition device according to the invention, the incident point of an electromagnetic wave such as a light beam is detected in a two-dimensional mode by the wave conducting device in the form of a matrix. However, even in the case where a number of information are simultaneously applied to the device, if the device has a function capable of scanning at high speed for every address, the recognition operation can be achieved without failure.

According to the principle of this invention, if a photodiode is employed as the photoelectric element, the beam receiving surface can be also utilized as a light display surface. Furthermore, if a memory layer made up of fluoroescent material is provided on the beam receiving surface or the transparent section, the function of the light pen can be remarkably increased.

ASPECT II

A second aspect of this invention relates to optical devices in which an optical input signal is converted into an optical signal system which satisfys predetermined input and output logical conditions.

In an encoder for converting a decimal number into a binary number or in a decoder for converting a binary number into a decimal number, an electrical circuit such as a diode matrix made up of OR circuits and AND circuit has often been utilized.

In designating the positional coordinates of an optical image or a optical point projected onto a plane, the coordinates are detected as electrical signals representing addresses by a group of photoelectric elements such as an array of beam receiving elements. These electrical signals are converted into digital codes by the encoder or other intricate electrical circuit so that the electrical signals can be used as input signals to an information processing device. In addition, it has been conducted through various processes by intricate electrical circuits to convert an operational result into a decimal number and to display it.

In an optical system according to the second aspect of this invention, time-related signals produced by optical signals are introduced to a beam path network for converting optical signals which network is provided with OR or AND logical circuits, for spatially process the time-related signals so that these signals satisfy the input and output logical conditions in advance, whereby new, different optical signal systems can be obtained from the output side of the beam path network.

The light processed by this example may be visible or invisible or invisible light ranging from ultraviolet rays to infrared rays, that is, it may be electronic beams or electromagnetic waves. However, a coherent optical signal having a narrow wavelength is more effective. It can be determined according to the object in use of the device whether the optical signal should be emitted continuously or intermittently or what the shape of the optical signal should be.

Figure 7:
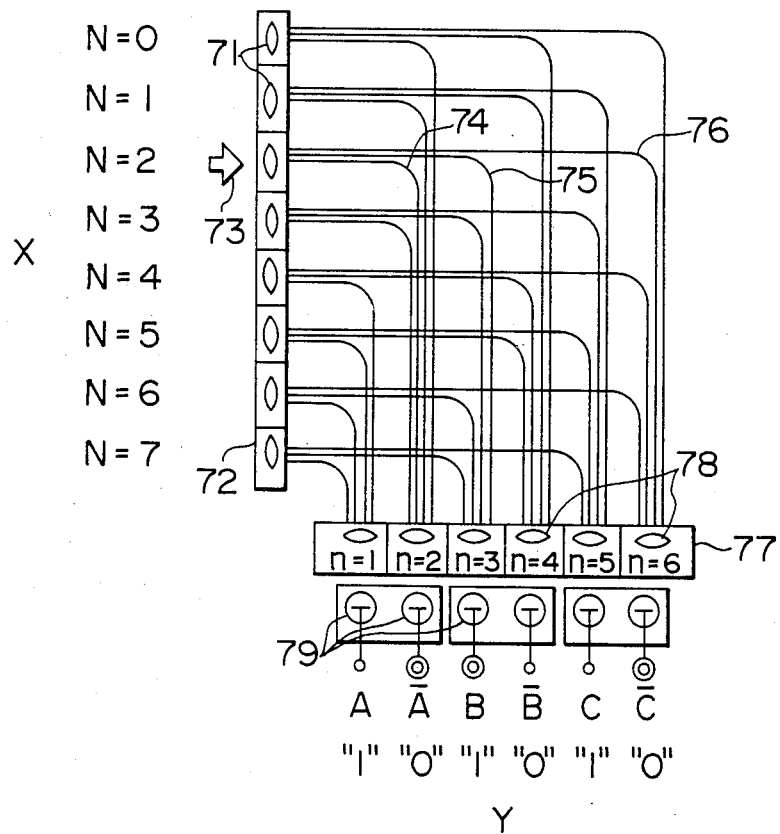
FIGS. 7, 8 and 9 are plan views showing optical encoders according to the invention.

FIG. 7 shows one example of an optical encoder according to this invention, which comprises an input channel 72 provided with eight beam incident points $N = 0$, $N = 1$ through $N = 7$ having optical filters or lens 71 as beam inlets. This optical encoder operates to select one of the eight incident points, thereby to provide an optical input signal corresponding to a decimal number. For instance, an optical input applied to the incident point $N = 2$ as is shown by a white arrow mark in FIG. 7 is introduced simultaneously to three optical fibers 72, 75 and 76 bundled together, and is discharged through focusing lens $n = 2$, $n = 3$ and $n = 6$ of the focusing lenses 78 forming an output channel 77. The optical input thus discharged is obtained as electrical output signals through the terminals marked by double circles out of the terminals of photoelectric elements, or photoelectric transducers, 79, which are disposed adjacent to the lenses 78, respectively.

It is assumed that six photoelectric elements 79 are divided into three pairs A and $\bar{A}$, B and $\bar{B}$ and C and $\bar{C}$ (where A, B and C representing a binary number "1", while $\bar{A}$, $\bar{B}$ and $\bar{C}$ representing a binary number "0") as is shown in FIG. 7. Then, the logical output of the optical input $N = 2$ becomes ($\bar{A}$ B $\bar{C}$). That is, a decimal number can be converted into a binary number as is apparent from the following equation:

$$(2)_{10} = (\bar{A} \, B \, \bar{C})_2 = (0 \, 1 \, 0)_2$$

In the optical encoder shown in FIG. 7, the relationship between the number X of the incident points and the number n of the beam discharge points is represented by equation $X = 2^{n/2}$ (where $n$ is a positive even number).

Figure 8:
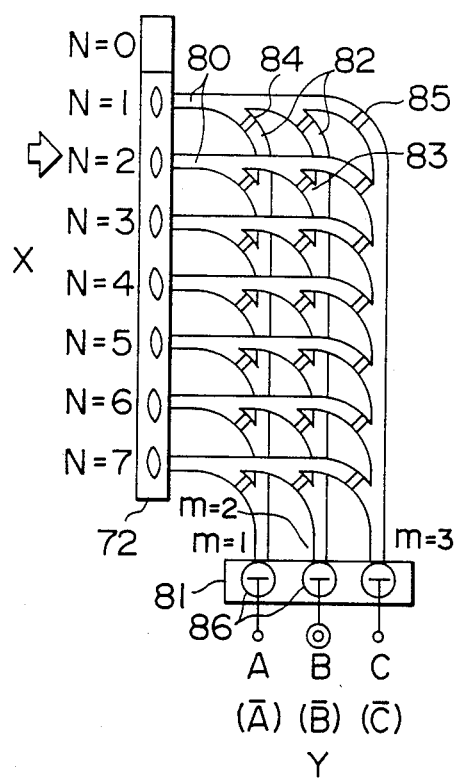

Shown in FIG. 8 is a modification of the optical encoder shown in FIG. 7. In this modification, instead of forming the beam path network with a number of optical fibers, the beam paths superimposed one on another are formed into one unit, and the beam discharge points providing a "0" output are omitted. As a result, the beam path network is greatly simplified, and the logical processing function of the optical encoder is remarkably improved. Thus, the optical encoder shown in FIG. 8 can be employed as an all purpose optical encoder.

More specifically, beam conducting paths 80 are connected to the beam incident points in the input channel 72, respectively, while beam branch path branches 82 are connected to the beam discharge points in the output channel 81, respectively. In addition, the beam path branches superimposed one on another, extending to one beam discharge point, is formed into one unit, as is shown in FIG. 8. Thus, a relatively simple beam conducting path network is formed. The beam path branches 82 are properly provided with beam path controlling gates 84 and 85 for controlling the transmitting and the shielding of the incident beam.

Accordingly, if the opening and closing of the gates are set in advance according to the input and output logical conditions required, the optical encoder can conduct its encoding operation. For instance, it is assumed that the case where the beam is provided at the beam discharge point is regarded as "1", while the case where the beam is not provided at the beam discharge point is regarded as "0". Under this condition, if a beam is applied, for instance, to the beam incident point N = 2 indicated by a white arrow mark, the beam is introduced to the beam discharge points $m = 2$ but to the beam discharge points $m = 1$ and $m = 3$. In this case, as the photoelectric elements 86 are provided respectively for the beam discharge points in the output channel 81, the beam applied to the beam incident point N = 2 is indicated as "010", that is, the decimal number "2" is encoded into the binary number "010". When no beam is applied to the beam incident points, that is, $(0)_{10}$, the output channel 81 provides $(000)_2$.

The relationship between the number X of the beam incident points and the number of the beam dischaarge points is represented by equation $X = 2^m - 1$ (where $m$ is an positive number).

Accordingly, if the number of the beam incident points is increased, the effect of the optical encoder shown in FIG. 8 is increased the more remarkably in simplification of the optical encoder. Although the number of the beam discharge points in FIG. 8 is a half of the number of those in FIG. 7, the function of the optical encoder shown in FIG. 8 is substantially the same as that of the optical encoder shown in FIG. 7.

If it is necessary to produce as electrical output signals the the logical variables "1" and "0" provided at the beam discharge points in the device shown in FIG. 8, it can be achieved by connecting the output terminal of the photoelectric element to a binary circuit comprising two parallel circuits one of which is adapted to provide the electrical output signal "1" when the element directly receives the beam, while the other the electrical output signal "0" when the beam is not received thereby by applying the beam to an inverter. The optical encoder thus modified has the same function in the output channel as that in FIG. 7. In addition, the beam conducting operation similar to that of optical fibers can be obtained if beam paths similar to an optical integrated circuit is formed in the beam conducting body with a material which is greater in refractive index than the beam conducting body.

Figure 9:
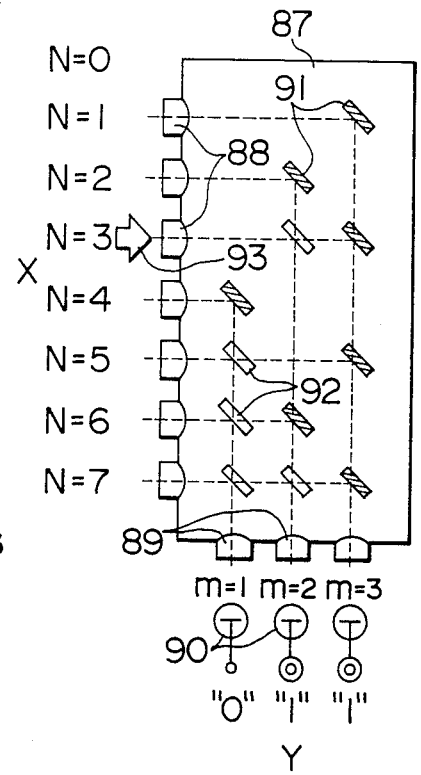

Another modification of the optical encoder according to the invention is shown in FIG. 9 which is a diagram illustrating the principle of this modification.

The modification shown in FIG. 9 has the same function as one shown in FIG. 8. The optical encoder shown in FIG. 9 comprises: an input channel provided with beam incident points 88 having optical lenses on the side X of a relatively flat, parallelopiped beam conducting body made of a beam transmissive material; and an output channel provided with beam discharge points 89 having lenses and photoelectric elements 90. In addition, beam paths are provided in the form of a matrix in the beam conducting body so that the beam incident points and the beam discharge points represent positional coordinates. Furthermore, the beam conducting body 87 is provided with reflective mirrors 91 and dichroic mirrors (or so-called half-mirrors) 92 at the positions predetermined according to the input and output logical conditions as is shown in FIG. 9. The reflective mirror 91 is adapted to deflect the incident beam at the beam incident point to the respective beam discharge point, while the half-mirror is adapted to deflect one part of the beam applied thereto to the respective beam discharge point and to let the other part pass through the mirror.

These mirrors, or reflectors, 91 and 92 are disposed in paths along which beams applied at the beam incident points advance, that is, beam paths indicated by dotted lines in FIG. 9. These reflectors may be built in the beam conducting body (hereinafter referred to as an optical conductor when applicable) 87, or may be replaced by grooves whose bottoms are mirror-finished.

When for instance a beam is applied to the beam incident point N = 3, as indicated by a white arrow, the beam is introduced to the beam discharge points $m = 2$ and $m = 3$, that is, electrical output signals appears at the terminals marked with a double circle in FIG. 9. Thus, the encoding operation is completed with a logical relation $(3)_{10} = (011)_2$.

As is apparent from the above-described principles of the various optical encoders according to this invention, the specific feature of the invention that an input selectively applied to the input channel provides a particular output based on the respective logical condition can be utilized in a fixed memory or a semi-fixed memory in which the beam incident points are utilized as inputs for selectively reading words while the beam discharge points are utilized as outputs for parallel reading.

Figure 10:
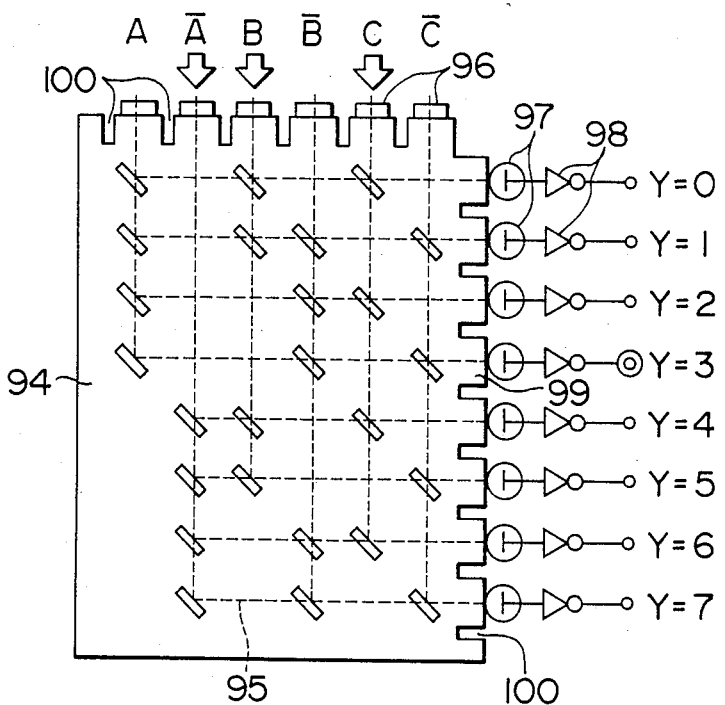
FIG. 10 is a plan view illustrating an optical decoder according to the invention.

Shown in FIG. 10 is the principle of one example of an optical decoder according to this invention, which comprises an input channel, an output channel, and a beam conducting body 94, the constructions of a beam conductor 94 and beam paths 95 being the same as described before. The input channel has six beam incident points 96 through which three-digit (A-B-C) binary codes are applied to the decoder. The output channel has eight beam discharge points to each of which a photoelectric element 97 and an inverter 98 are connected, as is shown in FIG. 10.

When beams are applied to the beam incident points A, B and C simultaneously, no beam is introduced to the beam discharge point 99 while the beams are introduced to the remaining beam discharge points, that is, the electrical output signal "1" is applied only to the terminal marked by a double-circle in FIG. 10 while the other terminals have no electrical output signals. Thus, there is established a logical relation $(011)_2 = (3)_{10}$ between the input and the output. Similarly as in the case described above, the other binary codes can be decoded into the respective decimal numbers by spatially processing the beams applied to the beam incident points.

The optical decoder is provided with guards 100 which prevent optical interferences from being caused between the adjacent beam paths in the vicinity of the beam incident points and the beam discharge points. These guards 100 may be obtained by merely cutting grooves as shown in FIG. 10. If light sources are so arranged in the optical decoder that beams are directly applied to the beam incident points and the application of the beams is selectively carried, the optical decoder thus modified will become a kind of optical operational device.

Next, the case where the effect of the optical decoder described above is applied to the retrieving of the positional coordinates of a light spot, will be described.

A beam receiving device 101 as a beam receiving matrix employing the principle described with reference to FIG. 2 or 3 is shown in FIG. 11. A number of saw-toothed-shaped beam reflectors 105 are disposed in the form of a matrix over the whole beam receiving area in a relatively flat, parallelopiped beam conducting body so that a beam received through a beam receiving surface 103 is reflected in the directions X and Y toward the sides 104 of the beam receiving device 101.

Furthermore, the beam input channels 108 of the optical encoders 106 and 107 according to the invention are coupled to the sides 104 mentioned above. The beam discharge points 109 of the output channels in the optical encoders are provided with photoelectrical elements 110. Thus, the beam applied to the beam receiving device 101 are reflected by the reflector in the direction X and Y, and introduced into the optical encoder 106 and 107 respectively. The beams thus introduced are encoded into electrical output signals in three-digit binary code through the photoelectric elements 110. That is, the coordinates of the beam spot 102 applied to the beam receiving surface 103 are obtained as three-digit binary numbers. If these binary numbers are converted into electrical signals, they can be used as input signals to a digital information device.

As is apparent from the above description, the conventional intricate process in which the address of an incident beam on a rectangular-coordinate graph, or that with respect to the X-axis and the Y-axis, is converted into an electrical signal, which is then encoded by an electronic device, can be eliminated according to the invention. In other words, the invention has the specific features that the coded information of a position can be directly and accordingly quickly obtained by a very simple optical device such as described above, and the input mechanism of the information processing device can therefore be simplified considerably.

The invention has been described in connection with specific embodiments in which the beam conducting paths are formed in a two-dimensional arrangement, however, it is to be clearly understood the invention can be applied to an embodiment in which the beam paths are those in a three-dimensional arrangement or are formed as desired.

ASPECT III

A third aspect of this invention relates to photoelectric conversion devices in which a beam is applied to one relatively large surface of a beam transmitting material, the beam thus applied is subjected to reflection, refraction or deflection in the beam transmitting material so that the light and shade, the position and the configuration of the beam are detected by photoelectric elements at an end surface of the device.

A photoelectric element made of semiconductor for detecting a beam applied directly to its surface as an electrical signal is known in the art. In order to detect the light and shade, the position and the configuration of the incident beam, it is necessary to dispose a number of photoelectric elements described above in a plane so that a variation in an electrical signal produced from the photoelectric element which has detected the incident beam directly is taken out.

In this connection, there is a device in which one ends of many optical fibers are disposed in a plane, a beam is applied to the ends thus disposed, and an optical quantity received by the device is detected by photoelectric elements provided respectively at the other ends of the optical fibers, or a device in which the other ends of the optical fibers are retrieved by a scanning element so that the optical quantity is detected by one photoelectric tube.

However, in order to increase resolution in these devices it is inevitable to increase the number of such elements, which leads to intricate wiring and information processing. That is, this method is uneconomical. Furthermore, a device employing a television system or a mechanically scanning system is employed for the same purpose. However, this device is disadvantageous in that its scanning speed is limited and its response characteristic is inferior.

Briefly stated, in the optical device according to the third aspect of this invention, when beams enter a beam conductor made of a glass or a plastic high in optical conductivity through its upper surface, namely, a beam receiving surface having a relatively large area, the beams thus entered are reflected by a beam reflecting section at the bottom surface toward a side of the beam conducting body which side has a relatively small area, and the reflected beams thus concentrated to the side are detected by a photoelectric transducer such as phototransistor, a photomultiplier tube or a color discrimination photoelectric element which is provided at the side.

In the case where beams are inclined with respect to the beam receiving surface, the directions of the beams can be so corrected as to be perpendicular to the beam receiving surface by the provision of a focusing lens or a prism before the beam receiving surface. This correction can be achieved more effectively by the provision of an auxiliary beam path which will be described below. An uneven or saw-tooth-shaped beam path is formed, as an auxiliary beam path, with a beam transmissive material having a different refractive index along the beam receiving surface of the beam conducting body so as to provide a beam conductor unit. A beam applied to the beam conductor unit thus formed is refracted through the auxiliary beam path and then reflected by the beam reflecting section on the opposite surface of the beam conducting body. The beam thus reflected includes a component which advances rightward or leftward in the main beam path to reach the photoelectric element directly, a component which is further reflected by the interface between the main and auxiliary beam paths to reach the photoelectric transducer, and a component which advances into the auxiliary beam path again.

If the angle of the uneven or saw-tooth-like surface provided for the auxiliary beam path is properly determined, it is possible to cause the component entered the auxiliary beam path again to repeat reflection and refraction and finally to enter the main beam path. In this connection, it is not always necessary for the auxiliary beam path to have a prism-like configuration, if the same effect can be obtained. That is, the configuration of the auxiliary beam path may be formed by the combination of curved surfaces and other surfaces.

If a beam reflecting section formed by the vacuum-evaporation of silver is provided on the surface of the beam conducting body around the part where the photoelectric element is installed, with the exception of the beam receiving surface, it can prevent the beams concentrated on a position in a predetermined region from being discharged, as a loss, outside from around the part where the photoelectric element is installed.

The term "beam" as herein used is intended to designate light including visible light, laser light, infrared rays, ultraviolet rays and X-rays, that is, any light which can activate a photoelectric element.

As is shown in FIG. 12, when beams 122 are applied to a parallelopiped beam conducting body or optical conductor 121 from above, the beams are reflected by a beam reflecting section 123 having mirrors, or beam reflecting surfaces, toward a photoelectric element 124, thereby being converted into an electrical signal. Reference numeral 125 is a lead wire connected to the element 124.

The angles of the beam reflecting surfaces are set properly according to the distances between the beam reflecting surfaces and the photoelectric element 124 so that the beams reflected concentrate on the photoelectric element.

If the beam reflecting section is made up of a number of minute beam reflecting surfaces, or is made like a staircase, or is curved like a curved surface so that the beams reflected are scattered, the concentration of the beam to the photoelectric element does not depend on the angle of the beam reflecting surface so much.

Another example of a photoelectric conversion device according to the principle described above is shown in FIG. 13. In this device, a beam reflecting section 123 is so designed that beams are reflected toward two sides of a beam conducting body 121 as indicated by the arrows and are received by photoelectric transducers provided on the sides. Another example of the photoelectric conversion device is shown in FIG. 14, which is so designed that one side 127 of the device reflects incident beams. A still another example of the photoelectric conversion device is shown in FIG. 15, which is so designed that a beam reflecting section 123 is provided on the slant bottom of the device so as to concentrate the reflected beams on a photoelectric element 124.

If a beam refracting section made up of uneven surfaces or lenses is provided on the upper surface of the beam conducting body 121 in such a manner that beams refracted thereby concentrate on the photoelectric element, the same effect as that of the examples described above can be obtained by this method also.

FIGS. 16(a), (b) and (c) show several examples of the photoelectric conversion device, in each of which a beam enters through a window 128 having a particular configuration into a beam conducting body, or an optical conductor, that is, the surface 129 other than the window is shielded against the entering of the beam. As is apparent from FIGS. 16(a), (b) and (c), the beam reflecting sections 123 are different from one another.

If the inner surface of the beam shielding member 129 is made plane or uneven as shown so that the beam is reflected thereby to apply to the reflecting section 123 at the bottom of the device or directly toward the side of the device, the concentration of the beams can be attained more effectively. The window 128 may be merely a hole, or may be provided with a concave lens or a convex lens.

Another example of the photoelectric conversion device (hereinafter referred to as a photoelectric converter when applicable is shown in FIG. 17, which is provided with a plurality of windows 128 which are covered with color filters $F_1$ and $F_2$ different in optical absorption wavelength so that electrical quantities detected by the photoelectric element differ depending on which window the beam has passed through. That is, according to this device, it can be detected which window the beam has passed through.

With the photoelectric conversion device as described above, a position in the beam receiving surface to which a spot-like beam has been applied can be detected. For the same purpose, a method in which a beam introduced to the detection end of the beam conducting body is divided into beams by the provision of a half-mirror or color filters and photoelectric elements are provided for the beams thus divided, may be employed.

In an optical device shown in FIG. 18, a number of photoelectric elements 124 are provided on one side of a beam conducting body 121. In this case, if it is found out which element has received a beam, it can be readily known to which zone $a$, $b$, $c$, $d$ or $e$ of the beam receiving surface the beam has been applied.

If in the case where the reflected beams, as is shown in FIGS. 14 and 18, reach the side opposite to the side of the photoelectric element, a reflective mirror 125 having a concave surface is provided there, the reflected beams can be directed to the photoelectric element.

The beam conducting body described above is formed with a single material; however, it may be formed with a plurality of materials different in optical transmissivity. Furthermore, the beam conducting body may be one having a hollow part inside if it can obtain the same effects as described above.

Figure 19:
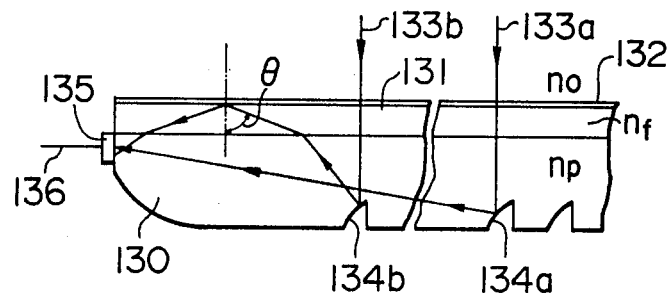
FIGS. 19, 20 and 21 are sectional views illustrating examples of optical guide means having auxiliary beam paths.

In an optical device shown in FIG. 19, a plane auxiliary beam path 131 is provided in parallel with and on a beam receiving surface of an optical conductor 130, that is, a main beam path, the refractive index $n_f$ of the auxiliary beam path 131 being smaller than that $n_p$ of the optical conductor 130. In addition, a surface reflection prevention film 132, that is, a film of magnesium fluoride is formed on the surface of the auxiliary beam path 131. An incident beam enters the optical conductor 130 from the air having its refractive index $n_o$. The relationship between these refractive indexes) is $n_o < n_f < n_p$.

An incident beam 133$a$ enters the auxiliary beam path 131, refracts, and reaches a reflection point 134$a$. At this point, the beam 133$a$ is reflected toward a photoelectric element 135 provided on the left side surface of the beam conducting body.

An incident beam 133$_b$ is reflected at a reflection point 134$_b$ into the auxiliary beam path 131 where it is refracted. In this case, if an angle which the direction of the beam reflected forms with respect to the upper surface of the auxiliary beam path is a critical angle or greater, the beam is completely reflected by this upper surface to enter the main beam path 130, thus reaching the photoelectric element 135.

Figure 20:
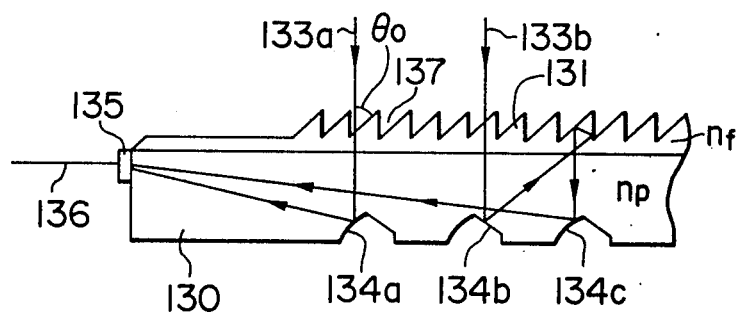

In FIG. 20, an auxiliary beam path 131 having a particular configuration and a refractive index $n_f$ is provided on the beam receiving surface of an optical conductor 130.

The case where a coherent beam having a single wavelength is applied to an optical device formed as described above will be described.

As is shown in FIG. 20, the auxiliary beam path 131 has a sawtooth-like part comprising beam receiving slopes 137 which form a Brewster angle $\theta_o$ with an incident beam 133$_a$. The inside surface of the beam receiving slope is formed as a half-mirror, as will become apparent later. Therefore, if a laser beam 133$_a$ having no loss due to polarization or reflection is applied to the optical device, it is reflected by a reflective mirror 134$_a$ provided in the optical conductor 130 to advance straightly in the optical conductor toward a photoelectric element 135 on the left side surface of the optical conductor. An incident beam 133$_b$ is reflected by a reflective mirror rightward and then enters the auxiliary beam path 131. Since this auxiliary beam path serves as a prism, the beam thus entered repeats reflection, enters the optical conductor 131, and is reflected by a reflective mirror 134 toward the photoelectric element 135.

The same effects as described above can be obtained by disposing the auxiliary beam path in a manner such that its saw-tooth like part is an interface between the auxiliary beam path and the beam conducting body.

Thus, if the construction of the auxiliary beam path is proper, efficiency in irradiating the photoelectric element can be increased, and accordingly a relatively weak beam can be effectively detected and in addition the beam receiving slopes, or the saw-tooth, of the auxiliary beam path can be made uniform in height.

Figure 21:
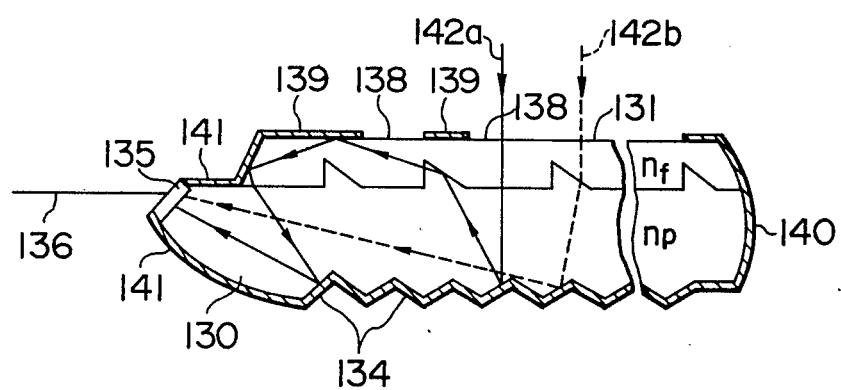

In an optical device shown in FIG. 21, a layer of silver and aluminum compound is applied by vacuum evaporation to a beam reflecting section 134 of an optical conductor body 130, a part of the beam receiving surface 139 of an auxiliary beam path 131, a right beam reflecting surface 140 and a part around a photoelectric element 135, as is hatched. The layer of silver and aluminum compound serves as a reflective mirror for beams in the optical device. For instance, a beam entering through a window 138 provided in the beam receiving surface repeats reflection and refraction, advancing along the solid line, and finally reaches the photoelectric element 135. In this case, the refractive index $n_f$ of the auxiliary beam path 131 and that $n_p$ of the beam conducting body 130 are selected so that the former is smaller than the latter: $n_f < n_p$.

An incident beam $142_b$ is refracted by the auxiliary beam path 131, and is reflected by the beam reflecting section 134 toward the photoelectric element 135.

The case where a plurality of optical conductors are combined together will now be described.

Figure 22:
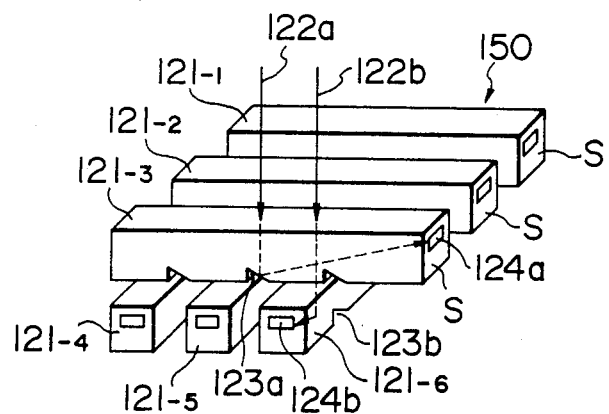
FIGS. 22 and 23 are perspective views showing modifications of the matrix type optical device.

Shown in FIG. 22 is a so-called photoelectric conversion plane 150 in which optical conductors 121-1, 121-2 and 121-3 such as described above are disposed side by side or in parallel with one another and are optically shielded from one another at the sides S thereof, and the group of the optical conductors 121-1, 121-2 and 121-3 thus disposed are set across another group of optical conductors 121-4, 121-5, and 121-6 disposed in the same manner.

The upper optical conductors are connected to the lower ones by an adhesive agent whose beam transmissivity or refractive index is equal to or greater than that of the optical conductors so that the parts connecting the upper and lower optical conductors can pass beams. Beam reflecting sections $123_a$ are provided at the parts of the optical conductor 121-3 which parts are not in contact with the lower conductors 121-4, 121-5 and 121-6.

A beam $122_a$ is reflected by the beam reflecting section $123_a$ toward a photoelectric element $124_a$ provided on one end of the optical conductor 121-3 as is indicated by the dot line. When a beam is applied, in such a manner as indicated by $122_b$, to a part of the upper optical conductor corresponding to the part where the upper and lower optical conductors are connected with one another, the beam $122_b$ is reflected by a beam reflecting section provided on the lower surface of the optical conductor 121-6 to advance to a photoelectric element $124_b$ provided on one end of the optical conductor $124_b$ as is indicated by the broken line.

In FIG. 22, the optical conductor are disposed with air gaps therebetween, but they may be disposed side by side with particular spacers therebetween which are narrow and thin films made of, for instance, metal through which no beam can pass. In this case, these spacers serve as beam reflecting walls or beam absorbing walls. Furthermore, if the ratio in area of the beam reflecting section of the upper optical conductor to the part thereof which is connected to the lower one is selected properly, or if the connection parts between the upper and lower optical conductors are made into half-mirrors, the beam reflection is conducted in the upper optical body while the beam transmission is effected to the lower optical body. At any rate, the constructions of the optical device described above can improve the resolution of incident beam in the photoelectric conversion plane.

Figure 23:
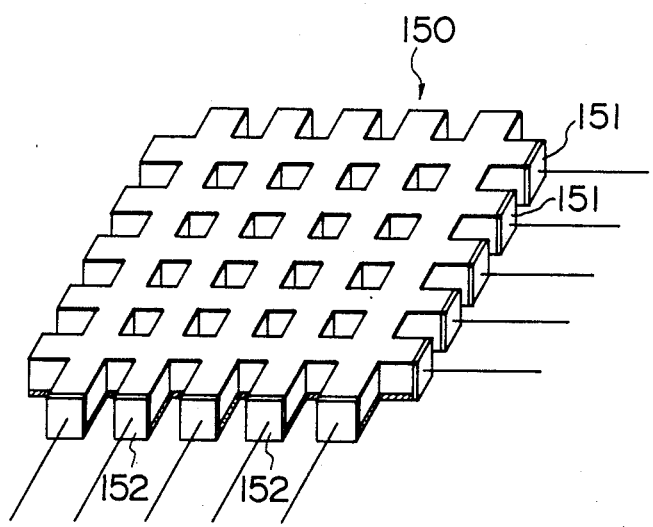

Another example of the photoelectric conversion plane is shown in FIG. 23 in which optical conductors in the form of a matrix are formed into one block, namely, an optical conductor matrix, the upper surface thereof being a beam receiving surface having transparent sections in the form of a matrix.

Similarly as in the example shown in FIG. 22, an optical pattern of character applied to the whole area of the beam receiving surface or the position of a beam applied to the beam receiving surface can be determined by scanning a number of photoelectric elements 152 provided on the ends of the optical conductor matrix. In this connection, interference between the optical conductors in rows or in columns can be prevented by the provision of protruded walls 153 (FIG. 2-) for absorbing, reflecting or scattering beams at the intersection parts of these optical conductors. For instance, in FIG. 2- an incident beam 154 is reflected by the reflecting section on the bottom surface to irradiate photoelectric elements 151 and 152, and therefore the incident position of the beam 15- can be detected. A component of the incident beam 154 reflected in other directions is reflected by the side surface, the upper surface, or the lower surface as is indicated by the dotted arrow, and is finally absorbed or reflected by the wall 153 so that the component of the beam does not advance into the other optical conductors.

Figure 25:
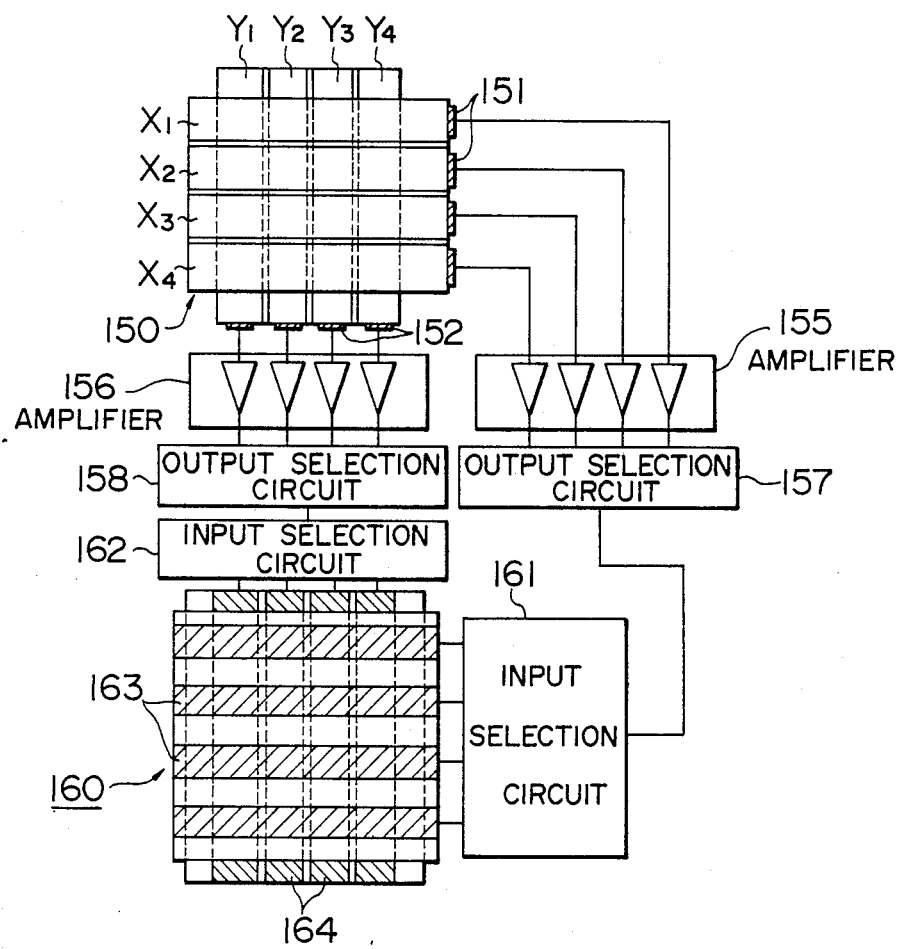
FIG. 25 is a block diagram showing an image reproduction system employing the matrix type optical device according to the invention.

The photoelectric output of the photoelectric conversion plane in the matrix form may be electrically processed either in a parallel mode or in a series mode. Shown in FIG. 25 is an example of the former case in which the outputs of the photoelectric conversion plane are processed in the parallel mode. An optical light and shadow or an optical configuration applied to a photoelectric conversion plane 150 acts selectively on photoelectric elements 151 and 152 which are provided respectively on the ends of optical conductors forming rows $X_1$, $X_2$, $X_3$ and $X_4$ in the direction X of the conversion plane 150 and on the ends of optical conductors forming columns $Y_1$, $Y_2$, $Y_3$ and $Y_4$ in the direction Y of the same, whereby electrical signals are produced from the photoelectric elements. These electrical signals are amplified by amplifiers 155 and 156 respectively, and are introduced respectively through output selection circuits 157 and 158 to a received beam reproduction display device 160 having input terminals corresponding to the output terminals X and Y of the photoelectric conversion plane 150.

The display device 160 may be of the magnetic record system or of the image scanning reception system in television or of the recopying system using record sheets. However, shown in FIG. 25 is a so-called matrix display device comprising groups of stripe-shaped transparent electrodes 163 and 164 which are arranged in the form of a matrix. Between the electrodes 163 and 164 a conversion material such as a liquid crystal is filled whereby variation in voltage is displayed by variation in transparency at the intersection points of the electrodes which have received the electrical outputs from the photoelectric conversion plane. In the case where the incident optical image is static, even if the display device is installed at a plane remote from the photoelectric conversion plane, the reproduction of the image can be carried out by respectively scanning input selection circuits 161 and 162 and the output selection circuits 157 and 158. In the case where the incident optical image is a dynamic one which varies with time, the simultaneous reproduction of the image can be achieved by applying the electrical outputs of the photoelectric conversion plane from the amplifiers 155 and 156 directly to the display device.

Thus, the devices described above are advantageous in that they can be utilized in various systems such as a pattern recognition system and a facsimile transmission system, and are suitable for mass-production at a low cost.

ASPECT IV

A fourth aspect of this invention relates to optical devices, or photoelectric conversion devices which detect at high speed the area, position or geometrical center of a beam applied thereto.

Heretofore, for the purpose of this type a television camera has been employed, or a number of photo-transistors arranged on a beam receiving surface have been employed. However, the former is disadvantageous in that it has an intricate optical system, is slow in response, and is liable to erroneously operate due to minute scratches on its beam receiving surface, while the latter is also disadvantageous in that it is high in cost because a number of photoelectric elements must be provided.

Briefly stated, in the device according to the invention, beams are applied to a beam receiving surface of an optical conductor matrix made of a transparent material, the beams thus applied are subjected to reflection and refraction in the matrix to concentrate on the side parts of the matrix, the beam thus concentrated are converted into electrical signals by photoelectric elements, and the electrical signals are processed by a peripheral count circuit to determine the optical image of the beams.

More specifically, beams to be detected is impinged on the upper surface of a beam conducting body, or an optical conductor, made of a transparent material such as glass and plastic, the beam conducting body being a flat parallelopiped having a relatively large surface area, and the beam thus applied are reflected by beam reflecting sections provided on the lower surface thereof toward the side parts of the beam conducting body. The beams thus concentrated to the side parts are converted into electrical signals by photoelectric elements such as photoelectric tubes and photo-transistors provided on the side parts, of which the outputs are processed by an electrical peripheral circuit thereby to determine the area, center, or optical quantity of the beams applied to the beam receiving surface.

In this connection, if photoelectric elements whose receiving wavelengths are different or photoelectric elements provided with color filters are properly arranged in combination, the colors of the incident beams can be detected.

With the optical device of this invention, its resolution somewhat varies depending on whether or not the incident beam irradiates the beam reflecting section (such phenomenon being caused depending on the position of the incident beam) even if the beam receiving area is constant; however, the center of the beam can be substantially exactly detected by the electrical peripheral circuit as will be described later.

The term "beams" as herein used is intended to designate light ranging from infrared rays to ultraviolet rays, or light capable of advancing in the optical conductor to activate the photoelectric elements provided on the sides of the optical conductor.

Figure 26:
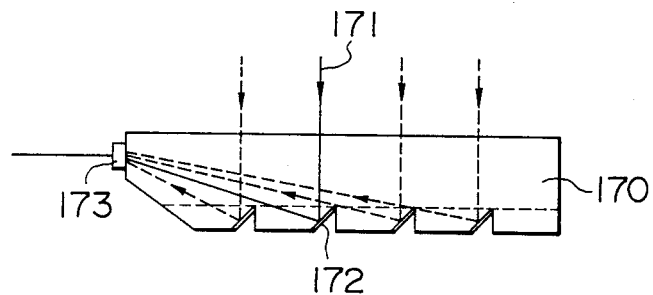
FIG. 26 is a sectional view illustrating another modification of the optical guide means.

FIG. 26 is a sectional view illustrating the parallelopiped-shaped optical conductor 170. When beams 171 entering the optical conductor 170 are reflected by beam reflecting sections 172 toward the left end of the conductor 120 as indicated by broken lines. The beam reflecting sections are in the form of saw-teeth, and the slopes of the saw-teeth have mirror surfaces, or beam reflecting surfaces, by which the beams are reflected. The beams thus reflected are caught by a photoelectric element 173 provided on the left end of the optical conductor 171, thereby to be converted into electrical signals.

In order that no matter what point in the upper surface of the optical conductor the beams are applied to, the beams are reflected to the beam receiving point, namely, the photoelectric element 173, the angles and depths of the slopes of the beam reflecting sections are different a little from one another as is apparent from FIG. 26. However, if it is allowed to reduce efficiency in concentrating the beams on the photoelectric element, the shapes of the beam reflecting surfaces 172, may be in the same or may be properly selected, which leads to the simplification of the process of manufacturing the optical devices. In this connection, it has been confirmed by the experiments that if the beam reflecting surfaces 172 are convex surfaces, the shapes of the beam reflecting surfaces may be almost the same, regardless of the distances between the beam reflecting surfaces and the photoelectric element.

Figure 24:
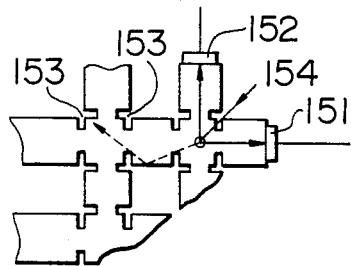
FIG. 24 is a plan view illustrating the internal construction of the device shown in FIG. 23.
Figure 27:
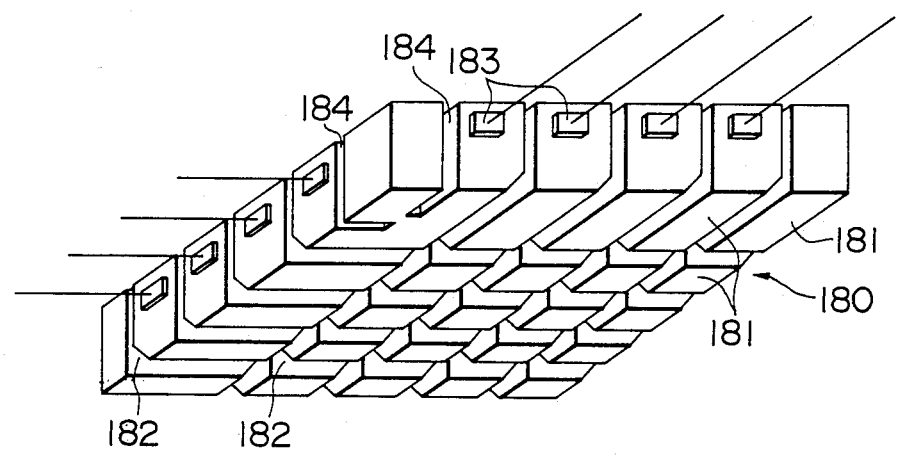
FIG. 27 is a perspective view of another modification of the matrix type optical device.

One example of a matrix type optical device employing the principle described with reference to FIG. 26 is shown in FIG. 27, which comprises an optical conductor 181 in which lines of beam reflecting surfaces 182 in the directions X and Y of the optical device are perpendicular to one another so as to determine the position of an incident beam in a two dimension as shown in FIG. 24. When a beam is applied to a part of the beam receiving surface, the beam irradiates the vicinity of the intersection part of the beam reflecting surface lines and is reflected in the directions X and Y thereby forming two reflected beams. These two beams advance to the respective photoelectric elements, thereby to be converted into electrical signals.

In this operation, the reflection direction and the refraction direction of the beam at the intersection part of the lines of the beam reflecting surfaces are repeated many times, as a result of which errors may be caused in detecting the beam incident point. However, this trouble can be eliminated by providing in the lower surface a hole having a depth corresponding at least to the height of the beam reflecting surface, in a direction perpendicular to the surface above the intersection part, or by providing a shield so that no beams enter the intersection part.

Figure 28:
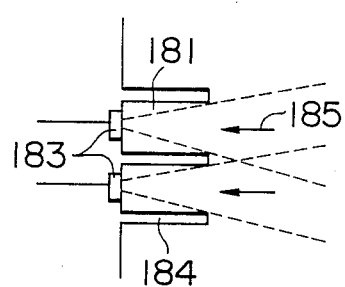
FIG. 28 is a plan view illustrating a modification of beam output sections.

Furthermore, although no problem is cause if the beams advance in the respective beam paths of the optical conductor, sometimes the beam is caused to enter the adjacent beam path, for instance, by the slight deformation of the beam reflecting surface, that is, the beam interference is caused. However, this problem can be solved by providing, for instance, a recess 184 between the adjacent beam paths near the photoelectric elements, as is shown in more detail in FIG. 28, in such a manner that a beam irradiation angle to the photoelectric element is limited. If the length or depth of the recess 184 is increased, the beam irradiation angle is so much reduced, as a result of which the reduction in resolution due to the different distances between the beam incident points and the photoelectric element can be prevented.

The improvement of the resolution can be achieved also by increasing the number of photoelectric elements provided on the sides X and Y and reducing the width of the recess 184; however, this method is inadvantageous in that the distance between the beam paths is limited by the size of the photoelectric element 183.

Figure 29:
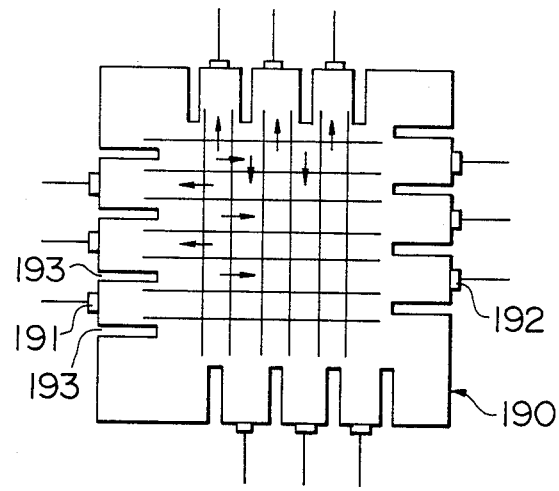
FIG. 29 is a plan view illustrating another modification of the matrix type optical device.

Another example of the matrix type optical device according to the invention is shown in FIG. 29 in which the sloped surfaces of the beam reflecting sections are arranged symmetrical so that the beams are reflected rightward and leftward, and the positions of the recesses and accordingly the photoelectric elements are staggered with one another as is shown in FIG. 29. In the optical device thus arranged, its resolution is improved by electrically combining the outputs of the photoelectric elements on both of the right and left sides of the optical device, and the beam incident point can be detected more precisely.

It is not always necessary to provide the photoelectric elements directly on the sides of the optical conductor. For instance, the optical device may be designed in a manner such that the photoelectric elements are connected through optical fibers to the sides of the optical conductor. Furthermore, it is not always necessary to concentrate the beams on the sides of the beam conducting body. For instance, the optical device may be so designed that the beams are concentrated to the center parts of the lines and column in the optical conductor.

Figure 30:
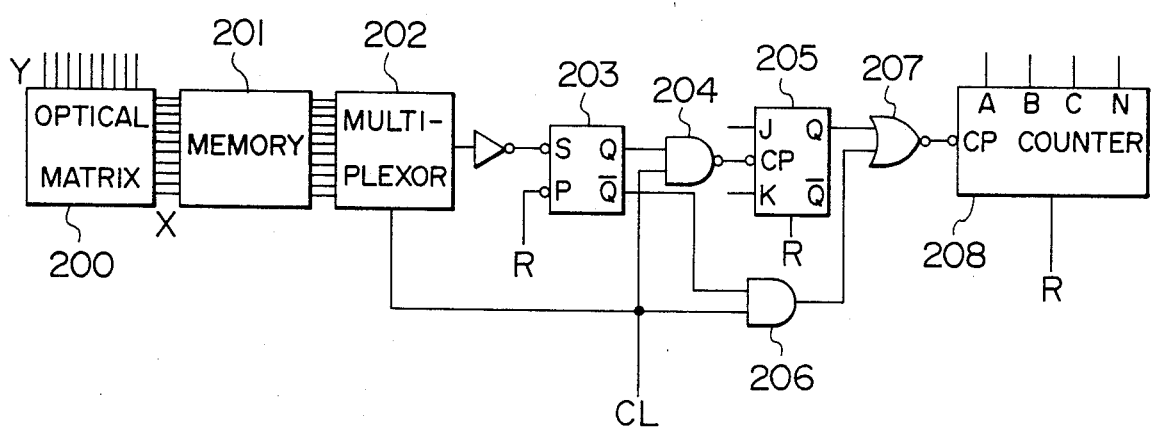
FIG. 30 is a block diagram illustrating an incident beam detection device employing the matrix type optical device according to the invention.

The example of a circuit for electrically computing the center point of a pulsive incident beam will now be described with reference to FIG. 30. The outputs of a matrix type optical device 200 such as described above are obtained at terminals provided in the directions X and Y thereof. Since the outputs at the terminals in the directions X and Y are processed in the same way, only the processing of the outputs at the terminals in the direction X will be described.

The outputs from the optical device 200 are stored in a memory device 201 which is scanned by a multiplexor 202. Clock pulses CL drive the multiplexor 202, and are applied through gate circuits 206 and 207 to a counter 208 where they are counted. In FIG. 30, reference R designates a reset terminal.

Before the scanning of the multiplexor 202 reaches an address in the memory device corresponding to the position of the beam incident point, the output of the multiplexor is at a "0" level and therefore no counting operation is carried out. Upon scanning of the address, an output at a "1" level is produced, so that a flip-flop 203 is set. As a result, the gate circuit 206 is closed while a gate circuit 204 is opened. Accordingly, the clock pulse CL is applied through the gate circuit 204 to a frequency divider 205, so that the pulse train frequency-divided by a factor ½ is counted by the counter 208 through the gate circuit 207.

Even if the output at the "0" level is produced by the multiplexor 202, the flip-flop 203 is maintained set. Accordingly, the address, or a bit number, of the center of the incident beam is counted and displayed at terminals A, B --- N of the counter 208. Thus, the central position of the incident beam can be determined with high accuracy by the peripheral counting circuit.

If the frequency division ratio of the frequency divider 205 is properly selected in a peripheral circuit similar to that described above, the dimensions of the incident beam can be determined in the directions X and Y, and accordingly, the area of the incident beam can be readily calculated.

The optical device according to the invention does not need the conventional device obtained by combining half-mirrors or other optical lens systems because the optical conductor matrix can be made relatively flat. Accordingly, errors due to the variation in the direction of the beam are scarcely caused. Thus, the optical device for precisely carrying out the photoelectric conversion at high speed can be realized at a low cost according to the invention.

ASPECT V

A fifth aspect of this invention relates to optical devices in which an optical transmission image or an optical reflection image which is obtained by irradiating an original picture is received by a beam conducting body, namely, an optical conductor, and is converted into electrical signals which are utilized to transfer or restore the image.

Heretofore, there have been proposed various devices for transmitting, reproducing an recording a picture. For instance, known in the art is a device, such as a television fax or a facsimile, which comprises: an image transmitting section in which an original picture is scanned by a spot-like optical source, and the light and shade of the beam reflected are converted into electrical signals for transmitting the image; and an image receiving section which reproduces and records the image in synchronization with the image transmitting section. However, the conventional device of this type depends on the mechanical scanning operation, and therefore its processing speed is limited thereby.

Recently, a system has been proposed in which a line-like optical source is applier to an object, and the beams reflected thereby are received by a multipoint type beam receiving section comprising a number of optical fibers and are converted into electrical signals by scanning the beam receiving section, thereby reproducing the image of the object in the same way as was described.

In addition, a device has been proposed in which an integrated photoelectric conversion plane obtained by arranging a number of semiconductor type photoelectric elements at the intersection points of a matrix, and an optical image incident on the plane is determined from the outputs of the photoelectric elements.

However, in order to improve the resolution of an image received in these conventional optical devices, a great number of beam receiving elements are inevitably needed. Accordingly, its information processing mechanism is intricate and uneconomical.

In an optical device according to this invention, a number of flat, elongated, transparent materials are piled one on another or disposed side by side, the adjacent materials being optically shielded, to form a plate-shaped beam conducting body assembly to the upper surface of which an optical image of a picture or a character is applied. The beams entered the beam conducting body are reflected or diffracted by a beam reflecting section provided on the bottom surface of the beam conducting bodies toward a side of the beam conducting body and are received by a photoelectric element provided on the side, thereby to form an image transmitting signal.

The transmission signals which are modulated in such a manner that the magnitude of the image transmitting signal indicates the light and shade of picture elements can be demodulated and reproduced as the intensity of the light source at the image receiving section, and can be recorded, for instance, on a photosensitive sheet, or by a method of discharge recording.

The beam path in the beam conducting body may be a hollow beam path of, for instance, vacuum air or gas, or a transparent liquid beam path of, for instance, water or tetrachloroethylene, or a transparent solid beam path of, for instance, glass or plastic.

The term "beam" as herein used is intended to designate light including visible or invisible one, laser, ultraviolet rays, infrared rays, and X-rays, or light capable of activating the photoelectric elements.

In the case where an optical source such as a laser beam having a particular wavelength, the provision of a color filter in the path of a beam incident on a beam receiving element can prevent the influence of other external beams.

A beam reflector in the beam conducting body should be designed in such a manner that mirrors having curvature such as to concentrate beams on the beam receiving elements on one end or both ends of the beam path are provided in the beam path at a number of positions, or a thin, cylindrical beam reflector extending perpendicularly to the beam path is provided on the bottom of the beam conducting body, or all the surface of the bottom of the beam conducting body is made into a mirror, or the beam reflecting section has an irregular uneven surface, thereby to cause the beams to be reflected and scattered.

In addition, when the whole area of a transmission image is substantially uniformly irradiated by a light source in the form of a plane, the beam reflected by the beam reflector provided on the bottom of the beam conducting body are reflected in the form of a matrix, or in the directions X and Y, in the beam path. Accordingly, if the beam receiving elements on the ends of the beam conducting bodies or on the peripheral portions of the beam conducting body plane are scanned, or successively detected, the transmission signals will be obtained. The recording and reproducing of the image in the image receiving section can be carried out in the same way as described above.

In general, the irradiation of a spot light source or a linear to an original picture is much simpler in technical and constructional viewpoints.

Figure 31:
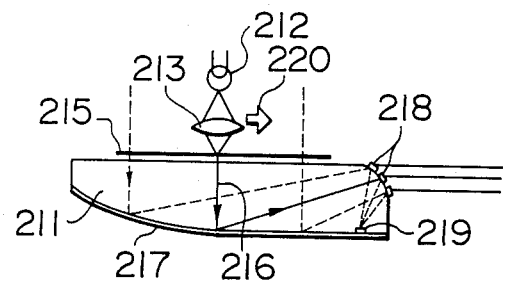
FIGS. 31 and 32 are sectional and plan views, respectively, illustrating a photoelectric transducer according to the invention.
Figure 32:
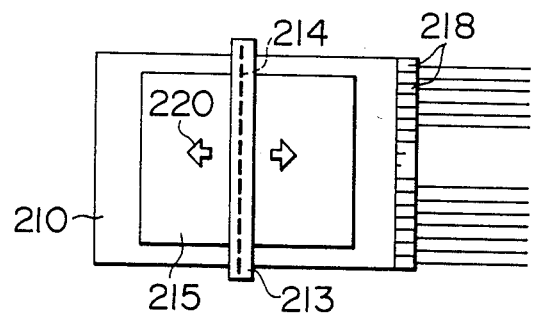

A beam conducting body 211 (hereinafter referred to as an optical conductor for simplification in description, when applicable) shown in FIGS. 31 and 32 is made of a flat, transparent acrylic resin. A line-like light 214 in the form of slits which are projected through a lens system 213 from a light source 212 are irradiated to an original picture film 215, and the beams 216 which have passed through the film 215 enter the optical conductors 211 through the flat upper surface thereof. The beams 216 are reflected by a curved reflection mirror 217 provided on the bottom of the beam conductor 211.

Advancing straightly in the beam conductor or being reflected by the inner wall of the beam conductor, the beams 216 are concentrated on a number of beam receiving elements 218 provided on the ends of the beam conductors and are converted into electrical signals according to the light and shade of the beams irradiated. In this connection, if a plurality of photoelectric elements 218 are provided at various angles at the beam concentrating end of the beam conductor so that the reflected beams can be utilized more effectively, or if instead of the provision of the elements 218, beam reflectors are provided at the above-mentioned various angles at the beam concentrating end so that the beam reflected thereby are concentrated on a photoelectric element 219, the efficiency of the optical device can be remarkably improved.

In order to simultaneously receive the reflected beams at the beam concentrating ends, a number of photoelectric elements 218 or 219, as is shown in FIG. 29, are provided at the beam receiving ends or near these ends. Accordingly, if the outputs of the photoelectric elements are simultaneously detected or successively scanned, all of the transmission outputs corresponding to the linear picture elements can be obtained. Furthermore, by scanning the whole area of the picture film 215 with the line-like light 214 described above in the direction of the white arrow, the output signals of the picture elements can be obtained continuously.

In this example, the reflection of incident beams by a mirror surface is utilized, but the mirror surface must be manufactured with high accuracy.

Figure 33:
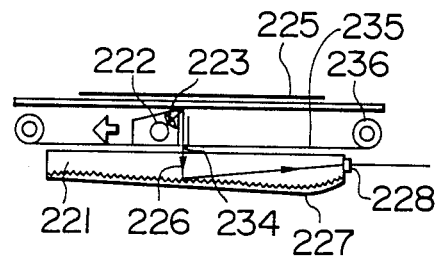
FIGS. 33 and 34 are also sectional and plan views showing a modification of the photoelectric transducer, respectively.

An optical device shown in FIG. 33 can be relatively readily manufactured, although its mechanical construction is somewhat intricate.

Incident beams entering a beam conductor may be beams passing through an original picture as in the method described with reference to FIG. 31, but in this example reflection beams from the original picture are employed as is shown in FIG. 33. More specifically, a line-like beam is irradiated from a light source 222 through a lens system to the picture 225, and the beams 226 reflected from the picture enter beam conductors 221.

Figure 34:
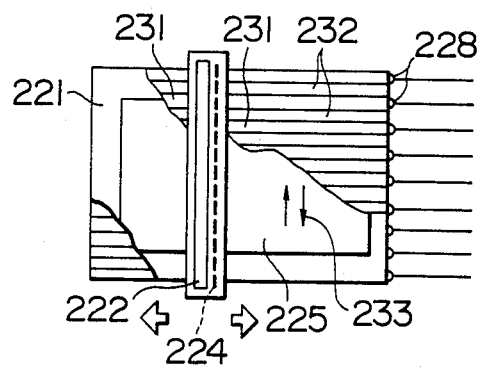

As is shown in FIG. 34, a number of beam conductors 221 are disposed side by side with non-transparent spacers 232 therebetween, thereby forming a beam conductor assembly. An uneven mirror reflection surface 227 is formed on the bottom parts of the beam conductors, or the beam paths 231, whereby the beams are subjected to regular reflection and irregular reflection and are concentrated on the respective photoelectric elements 228 provided at the ends of the beam paths. The photoelectric elements 228 operate to convert the beams into electrical signals.

In this case, the spacers 232 shield the incident beams reflected by the picture thereby to form shadows, and therefore the resolution of the optical device is reduced as much as the formation of the shadows. Accordingly, if the incident image from the picture is enlarged by for instance a Fresnel lens and is applied to the beam conductors, the resolution can be improved.

A method of substantially improving the resolution will be described. In this method, the width of the beam path 231 is made smaller than that of the spacer 232, and the picture 235 is moved as much as the width of the spacer 232 in the directions of the arrows 233 substantially perpendicular to the scanning direction of the line-like light. The photoelectric outputs are successively detected in synchronization with both the amplitude of this movement and the scanning speed of the light source. If these outputs are consolidated in order, an optical image formed by picture elements indicated by the intersection points of the beam paths 231 and the line-like light can be obtained, and a picture transmitting signal having a resolution with precision depending on the width of the beam path 231 can therefore be obtained.

The optical device further comprises a slit 234 serving as windows through which the incident beams are applied to the beam conductors 221, a shield cover 235 on the beam conductors, and a cover winding section 236.

In the above description, the picture 225 is moved as much as the width of the spacer 232, but the same effect can be also attained by moving the beam conductor assembly, or by the shutter action of spacers such as liquid crystals capable of electrically selective scanning.

Figure 35A:
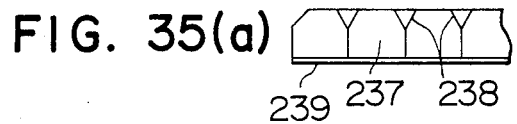
FIGS. 35(a) and (b) are partial sectional and plan views showing the relationship between beam paths and spacers.
Figure 35B:
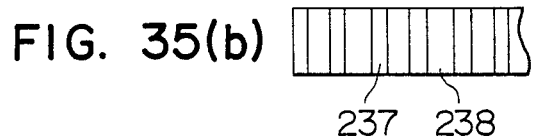

The shape of the spacers shown in FIG. 34 is not limitative. Another shape of spacers 238 is illustrated in combination with the beam paths 237 in the beam conductor assembly in FIGS. 35(a) and (b) which are a sectional view and a plan view, respectively. The optical device shown in FIGS. 35(a) and (b) further comprises a plane reflector 239, which may be a reflector having an uneven surface.

It goes without saying that in this example also, the light and shade of the optical image can be transmitted and reproduced by the modulation and demodulation of the signals, respectively.

In the above description, a line-like light is employed in scanning the picture; however, a spot-like light source may be also employed for obtaining the image signals if main-scanning and sub-scanning are carried out with the light source.

In the case the spot-like light source is employed, a cylindrical beam conductor assembly is formed by arranging on its cylindrical surface linear picture elements receiving linear beams as shown in FIG. 32 or 34. The assembly thus formed is turned at high speed while the sub-scanning is carried out with the spot-like light source, that is, an image recording device having quick responsibility can be obtained.

The image receiving section is designed in such a manner that in FIGS. 31 through 34, the beam receiving elements 218 and 228 of the flat beam conductors are replaced with demodulation light sources, the pictures 215 and 225 are replaced with photosensitive sheets, and the line-like light sources 212 and 222 are removed but the slit 234 and the shield cover 235 are retained. The shield cover is not always necessary, but it is provided for preventing unnecessary beams from leaking into the beam paths and for protecting the photosensitive sheet.

In the optical device thus organized, the movement of the slit in synchronization with the scanning in the irradiation of the line-like light to the picture element in the image transmitting section, causes the sensitive sheet to record and reproduce the same optical image as the transmission image.

The transmission system of an image may be of the phototelegraphy or of the facsimile transmission. However, a transmission system relating to the image receiving section and the image transmitting section in the case where the beam conductor assembly according to this invention are employed will be described with reference to FIG. 36.

In the image transmitting section, a picture 252 to be transmitted is placed on the beam conductor assembly 251 and is irradiated and scanned by a light source 253 driven by a driving circuit 254, as a result of which photoelectric outputs corresponding to the light and shade of the picture 252 are detected by beam receiving elements 241. Those output signals are electrically scanned by a section generally indicated by 243, and are introduced through a modulator and an amplifier to a section 243 where these output signals are processed to be transmitted. The signals thus processed are transmitted through a wire or wireless system to the image receiving section.

Figure 36:
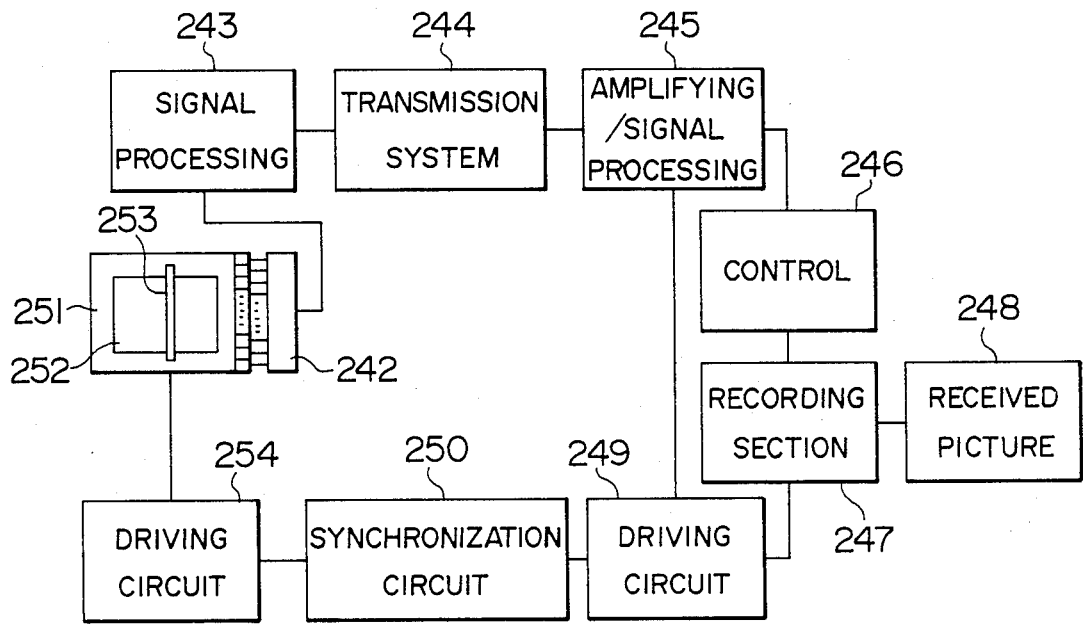
FIG. 36 is a block diagram showing an image transmission system employing the photoelectric transducer according to the invention.

In the image receiving section, the signals thus transmitted are received, and amplified and processed in a section 245. The signals thus treated are demodualted, or applied to a control circuit 246 for controlling the output of a light source, thereby being converted into an optical image which is applied, as incident beams, to a receiving beam conductor assembly formed in the same manner as that in the image transmitting section. In FIG. 36, reference numeral 247 designates a recording section for the photosensitive sheet, and reference numeral 248 designates a received image.

In this operation, the slits in the image transmitting section and the image receiving section are driven by driving circuits 254 and 249, respectively. If these driving operations are synchronized by a synchronization circuit 250, the system described above will operate as a so-called facsimile system.

In the above description, the beam conductor body assembly in the image transmitting section is the same as that in the image receiving section. However, a circle-to-line conversion recording system employing a number of needle electrodes or optical fibers, a static recording system or an electronic scanning system may be employed in the image receiving section.

This invention can provide a function as a so-called television fax employing television system in the image transmitting section and the image receiving section. In addition, if the image transmitting section and the image receiving section according to the invention are coupled directly to each other or if the optical image is controlled by the beam receiving section at the ends of the beam conductor assembly so as to be recorded on a photosensitive sheet, an image copying device can be obtained.

If in the case where an incident light source in the optical range of ultraviolet is employed in the image transmitting section, a fluorescent material is applied to the beam receiving end of the beam conductor, the detection more suitable for the control of the optical image can be carried out.

The method of processing an incident optical image from a picture placed on the optical conductor plane has been mainly described. However, the method of this invention can be utilized in laser holography transmission. In other words, if a coherent beam having phase variation and intensity variation as an incident optical image is applied to an object. If a so-called object beam which is a beam reflected by or transmitted through the object, and another coherent beam (a reference beam) are applied to the optical conductor in such a manner that these beams are piled one on another on the upper surface of the beam conductor, a hologram which has been recorded on a dry photographic plate heretofore can be converted into the light and shade represented by electrical signals for transmission. In the image receiving section, the light and shade represented by the electrical signals received is converted into the light and shade of the light source, which is scanned and reproduced in synchronization with the image transmitting section so that the resultant hologram is recorded, as interference fringes, on a dry photographical plate. In the reproduction of the object image, according to the technique of irradiating a coherent beam to the hologram, the interference fringes serves as diffraction grating in the same manner as in the conventional laser holography. Therefore, if a dry photographical plate is placed at the position of the real image, the object image can be reproduced.

As is apparent from the above description, the system according to this invention can be effectively applied to the transmission and reproduction of various images and is economical.

ASPECT VI

A sixth aspect of this invention relates to display devices in which a beam having an optional wavelength is entered into openings of an optical shutter operated electro-optically or mechanically, thereby to display a mono-color or multi-color image.

In a conventional display device such as for instance a television set, the size of the cathode-ray tube is limited. In order to overcome this difficulty, or to make it greater in size and flatter in shape, there has been proposed an image display device employing a matrix type plasma display system or an electroluminescent diode array system. However, this conventional image display device is disadvantageous in that for instance, it is difficult to increase the density of display picture elements and also the clearness of a display picture.

These difficulties have been overcome by this invention employing a relatively simple principle, which provides an image display device in a plane and solid state. In this invention, an optical conductor is provided with a light source for irradiating a number of reflector lines, and beams which have selectively passed through an optical shutter are employed as picture elements so as to display a desired image.

Figure 37:
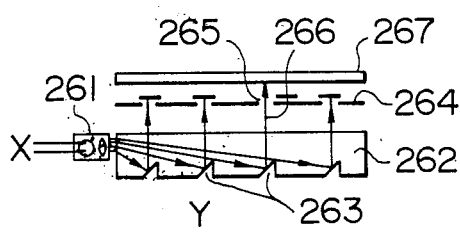
FIG. 37 is a side elevational view for describing the principle of an image display device according to the invention.

The principle of this invention in its sixth aspect will be described with reference to FIG. 37. When beams excellent in directivity are uniformly applied by a light source 261 to saw-tooth-like reflector lines 263 arranged in the direction Y on the bottom of a parallelopiped transparent optical conductor 262, the beams thus applied are reflected upward thereby to form optical bit lines as indicated by the arrows in FIG. 37. When the optical bit lines thus formed irradiate an optical shutter 264 provided in the paths of them, the emission beams which have passed through openings 265 of the optical shutter are displayed as picture elements 267 on a display surface 267. In this operation, if the reflective slopes of the reflector lines 263 and the openings, or windows, of the optical shutter are longer in the direction perpendicular to the surface of the drawing sheet, the bit lines of the distribution beams which are emitted from one of the many light sources on the X-side of the optical conductor are selectively passed through the optical shutter, that is, a beam corresponding to one bit is passed through the optical shutter and is displayed on the display surface in the case of FIG. 37.

Figure 38:
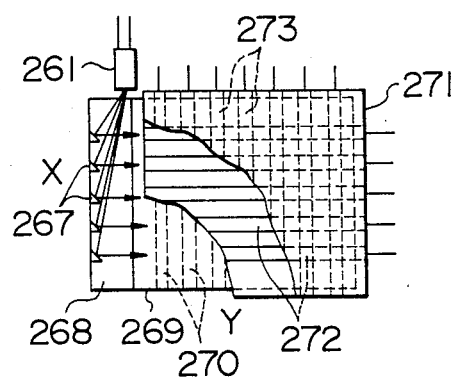
FIG. 38 is a top view illustrating the image display device.

In another example of the optical device shown in FIG. 38, only one light source 261 irradiates a beam distributor 268 which is provided with a number of beam distributing reflectors lined on the X-side of the optical device, thereby to form distribution beams, which are applied to the reflectors 270 lined in the direction Y on the bottom of the optical conductor 269 in the same manner as described above. Accordingly, the beams reflected by the reflector lines 270 form upward distribution beams, to irradiate all of the bits. In this case, if a matrix type optical shutter described below is employed as the optical shatter 271, the transparent bits can be selectively opened and closed at high speed. In this matrix type optical shutter, groups of parallel-strip-like transparent electrodes 272 and 273 are crossed with each other with electro-optical material such as liquid crystal being interposed therebetween so that the transparency is controlled by the application of an electrical field. The same effect can be attained by the provision of optical shutters for selecting distribution beam light sources, between these light sources and the side of the optical conductor.

If it is required to increase the bit density of the slit-type or matrix type optical shutter, two optical shutters 278 and 279 or more are piled one on another in such a manner that adjacent distribution beams from the light source 274 pass through the respective windows of the different optical shutters; more specifically, for instance one of the two adjacent distribution beams is directed toward a window of the lower optical shutter 278 by the strip-like reflector 276 while the other is directed toward a window of the upper optical shutter 279 by the strip-like reflector 276 in FIG. 39. In the example shown in FIG. 39, the reflector lines are provided on the upper surface of a support 275.

It goes without saying that the increase of the density of the optical bits made by the distribution beams can be achieved by the increase of the density of the reflector lines in the optical conductor. The arrangement of the reflector lines shown in FIG. 37 or 38 is not limitative, and it may be a series of concaved surfaces. In the latter case, the optical bit density depends on the bit density of the optical shutter.

The color display according to this invention is carried out as follows: The principle of construction of a color display device for carrying out this color display is shown in FIG. 40, in which three optical conductors 281, 282 and 283 similar to that illustrated in FIG. 37 are piled one another and provided with optical sources 284, 285 and 286 which emit green (G), blue (B) and red (R) on the sides thereof, so that the resultant beams are formed by uniting the distribution beams of the three primary colors.

FIG. 4(a) illustrates a method of uniting the three primary color beams, in which an image of one picture element is formed by passing the green, blue and red distribution beams respectively reflected by the reflection surfaces 290, 291 and 292 of the optical conductors 281, 282 and 283 through a beam converging section comprising one aperture or a minute focusing lens, or three apertures or minute focusing lenses provided respectively for the three distribution beams. However, this may be achieved without employing such a converging section.

Another method is shown in FIG. 41(b) in which dichroic mirrors which selectively transmit and reflect beams are formed on the slopes 294 and 295 of the reflectors, the slope 293 being an ordinary reflecting mirror.

If a photosensitive recording material such as an electronic picture sheet and an ordinary printing paper using silver salt is placed directly on the image display surface or if an optical system such as fiber optics face plate is interposed between the photosensitive recording material and the image display surface, the image can be recorded.

The beam described above is visible, but it may be invisible one if it can be employed for the recording of images. Especially, a laser having a single wavelength can be employed more effectively.

Shown in FIG. 42 is an embodiment of the optical display device according to the invention in which four reflection grooves each having a saw-tooth like cross section are provided in parallel to the X-side of a plate-shaped optical conductor 300 made of an optical methacrylic resin, and aluminum is vacuum-evaporated on the slopes of the grooves so that they serves as reflective mirror surfaces 301 in the beam paths. Furthermore, three light sources 302 are provided on the X-side of the optical conductor. When the beams applied in parallel to the Y-side of the optical conductor irradiate the reflector lines 301, distribution beams of four bits are obtained on the upper surface of the optical conductor. The optical display device further comprises an optical shutter 303 having a beam transmitting slit. In this optical shutter, there are provided two glass plates spaced apart by 15 $\mu$ from each other on the inside of each of which there are provided four strip-like transparent electrodes 304 in parallel to the X-side in such a manner that the upper electrode confronts the lower one, and a nematic liquid crystal is interposed therebetween.

In the display device thus organized, upon lighting one of the light sources 302 four distribution beams reflected by the reflector lines are provided on the upper surface of the optical conductor 300. Upon application of an electric field of about 100 $\mu$ W/cm$^2$ to three pairs of opposite electrodes 304, the electrodes to which no electric field is applied becomes the beam transmitting slit 305 mentioned above. Accordingly, one of the distribution beams, that is, a beam representing one bit is introduced to the display surface and is employed as one picture element. Accordingly, if the display addresses of such picture elements are successively scanned and selected while optical color moduration is effected by the excitation power moduration of the light sources or by changing the excitation pulse width, an image having light and shade can be displayed. In this case, if the display surface is of a screen, the projection of on enlarged image can be effected. In addition, the color image display can be achieved by the use of light sources of different color beams. Furthermore, if the electro-optical material such as the liquid crystal used in the optical shutter is colored, the contrast ratio at beam transmitting points can be improved.

Figure 43:
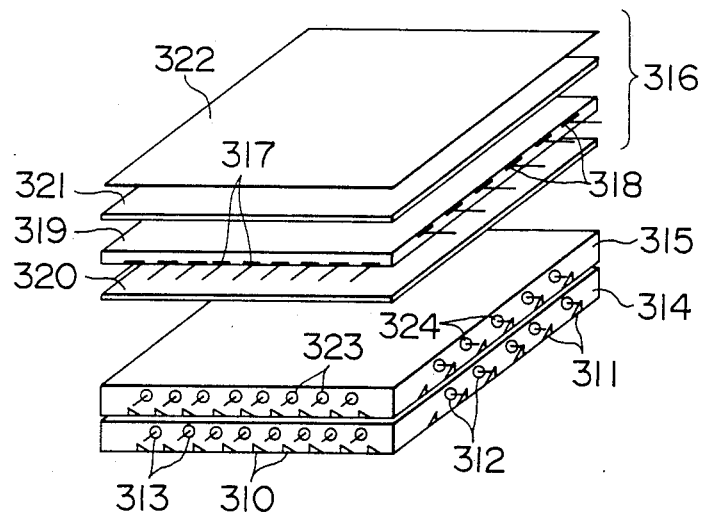
FIG. 43 is also a perspective view illustrating a color image display device according to the invention.

Another example of the optical display device is shown in FIG. 43, in which Y$m$ pieces of reflector lines 310 and X$n$ pieces of reflector lines 311 are disposed in parallel to the sides X and Y of an optical conductor made of an optical glass, respectively, the former lines and the latter lines being perpendicular to one another on the bottom of the optical conductor, and Y$m$ pieces of light sources 312 and X$n$ pieces of light sources 313 whose wavelengths are different are provided on two sides of the optical conductor, respectively, thereby to form a matrix type optical conductor. Two matrix type optical conductors thus formed are piled on one another, as is shown in FIG. 43.

The light sources 312 and 313 form distribution beams in line and column through reflector lines in the two layers of optical conductors. Above the two layers, there is provided a matrix type liquid crystal optical shuttr 316 having (X$n$ × Y$m$) pieces of bits. In other words, an electrode section 319 is formed by disposing X$n$ pieces of strip-shaped transparent electrodes 31 perpendicularly to Y$m$ pieces of ones 317 with a liquid crystal being interposed therebetween, and the electrode section 319 is sandwiched by a plate-shaped polarizer 320 and a plate-shaped analyzer 321 whose deflection directions are in parallel to each other.

In this case, the liquid crystal has a so-called torsional type molecule arrangement which is obtained by the torsion of one of the glasses sandwiching the liquid crystal. Accordingly, the polarization angle of an incident beam is turned by 90° by the liquid crystal therefore, only the intersection point of the electrodes applied with electronic fields becomes a beam transmitting bit on the basis of an electric field effect torsion control system, as a result of which picture elements can be displayed on a display surface 322.

The wavelengths of light source lines 312, 313 and 323 are selected to be those of red (R), blue (B) and green (G), respectively. An optical system is so designed that the three color distribution beams for a predetermined bit are united at the display surface 322, thereby to carry out the color display. A light source 324 is not always necessary, but it is provided as an auxiliary light source which is used when required.

If a brightness signal in the television image receiving system is applied to one of the light source lines while beams corresponding to color difference signals are obtained from the remaining light sources, the color image display can be carried out.

Figure 44:
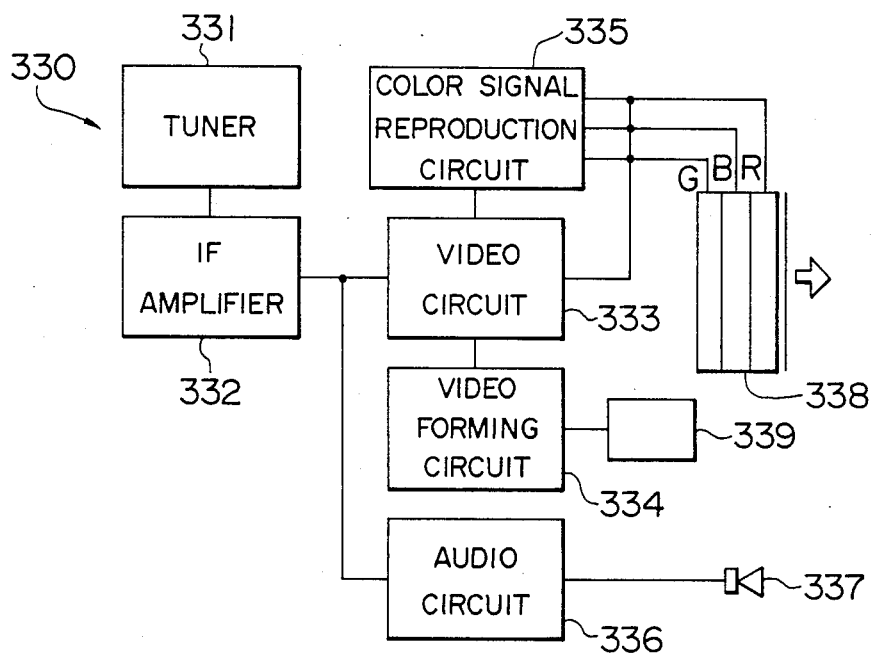
FIG. 44 is a block diagram indicating an electrical system of the device shown in FIG. 43.

A color television image receiving circuit employing the image display device according to this invention is shown in FIG. 44 which comprises a tuner 331 receiving a television signal 330, an intermediate frequency amplifier 332, a video circuit 333, a video forming circuit 334, a color signal reproduction circuit, an audio circuit 336, a loudspeaker 337, and the image display device 338 of this invention. In the conventional CRT or image receiving tube, an electron beam is synchronously deflected as much as the horizontal and vertical widths of the image, and the video forming circuit therefore needs a deflection circuit and a high voltage circuit. However, the provision of the deflection circuit and the high voltage circuit can be eliminated according to the invention. The function of the video forming circuit can be achieved merely by providing a light source beam modulation circuit 339.

As was described above, the employment of the image display device according to this invention can provide various optical devices. If it is necessary to prevent the interference of beams to the adjacent beam paths in the optical conductor, it can be prevented by interposing between the adjacent beam paths a spacers small in width and different in refractive index or non-transparent film spacers.

In the case where a plurality of optical conductors are piled one on another, air gaps or spacers having different refractive index may be interposed therebetween. Furthermore, instead of connecting the optical conductor directly to the light source, it may be connected through an optical fiber plate to a light source or an electron scanning type flying spot tube which is provided at a desired position.

Concrete embodiments of this invention are for instance industrial or private personal image display devices, wall type television sets, video telephones and large image display devices. Especially, this invention is effective in the large image display device. A so-called stereoscopic television may be obtained by providing two-eye information images on the display surface and placing a lenticular plate on the display surface. In addition, if the image display device is combined with the photosensitive recording material, the present invention can be applied to image recording devices and image transmitting systems such as for instance home-facsimile devices. Thus, this invention can be applied to various optical devices, and besides the image display devices of the invention can be produced on a large scale and are therefore economical.

ASPECT VII

A seventh aspect of this invention relates to plate-shaped image display devices in which a number of distribution beam wave are applied to an electro-luminescence matrix or a fluorescent display surface, and when the beams impinge on a luminescent body, the luminous body emit light, at the points to which the beams have applied.

In a conventional image display device, it is limited to increase the area of its display surface, and since it involves some problems on its brightness and clearness, it is difficult to obtain a fine display image. For instance, since in a present television set the size of a cathode ray tube is necessarily limited, a plate-shaped display device such as a matrix-type plasma display device, a photo diode array device, an electro-luminescence device and a liquid crystal type display device have been proposed to increase the area of the display surface; however, it is still unsatisfactory in the respects of size, coloration, and clearness.

An object of this invention is to carry out an image display with a plane and solid image display device formed on the basis of a relatively simple principle, in which all of the difficulties accompanying the conventional display device have been overcome. The image display device according to this invention essentially comprising an optical conductor with light sources for emitting beams. An intersection point of one selected beam and a luminescent body becomes a bright point, thereby to display an image as desired.

Figure 45:
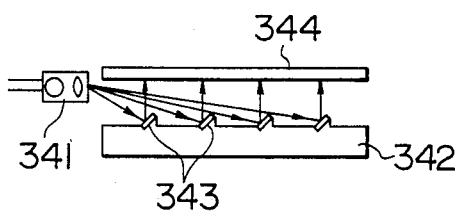
FIG. 45 is a sectional view for describing the principle of an image display device according to the invention.

The principle of the image display device according to this invention will be described. As is illustrated in FIG. 45, there is provided a so-called a radiation line director in which beams having fine directivity are uniformly emitted from a radiation source 341 to reflector lines which have saw-tooth-shaped reflective surfaces 343 arranged on a support 342 and are extended perpendicularly to the surface of the drawing, and the beams thus emitted are reflected, as distribution beam lines, as indicated by the arrows. These beam bit lines impinge on a luminous display surface 344 such as a voltage excitment type electro-luminescence matrix or a fluorescent surface provided above the support, thereby to produce bright points.

Figure 46:
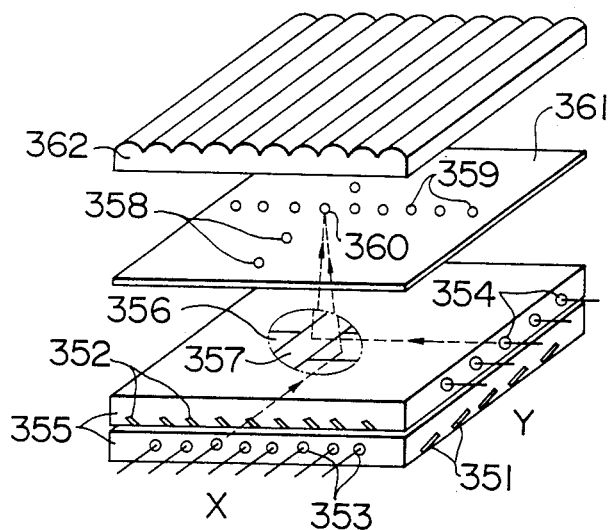
FIG. 46 is an exploded view illustrating an image display device employing the principle described with reference to FIG. 45.

As is briefly illustrated in FIG. 46, two radiation line directors are piled one on another in such a manner that a number of parallel reflector lines 351 and 352 similar to those described above are perpendicular to each other, and a number of radiation sources 353 and 354 are provided on the sides of the directors which sides are confronted with the reflective slopes of the reflector lines. As a result, a matrix type radiation director 355 is formed.

One radiation source is selected out of each of the radiation source groups 353 and 354, and distribution beams are emitted therefrom and are distributed by the reflectors whereby a bit column 358 and a bit line 359 are formed above the director 355. If the beams reflected by the reflectors 356 and 357 and then united together at the intersection point 360 of the bit line and the bit column have the same wavelength, these beams are united more strongly than the other distribution beams.

Figure 47:
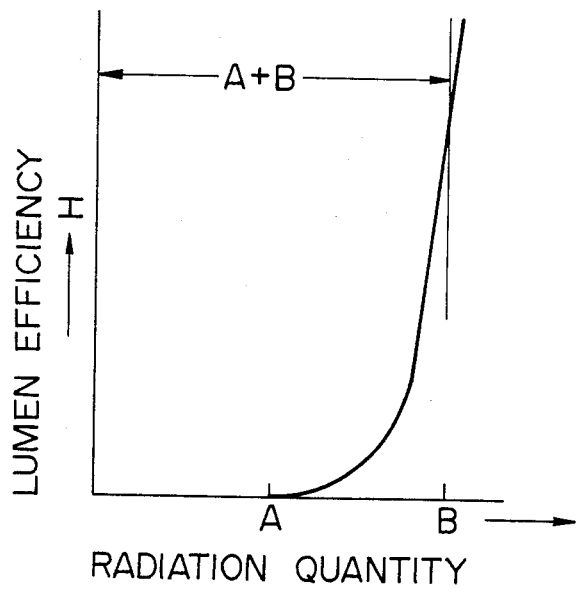
FIG. 47 is a graphical representation indicating the luminescent characteristic of a fluorescent material employed in the device shown in FIG. 46.

Accordingly, if a non-linear material which quickly increases a lumen efficiency to emit light upon addition of radiation quantities A and B as is indicated in FIG. 47 is coated over the phosphorous or fluorescent display surface 361, or a material such as a rare earth compound fluorescent material which emits light by the two-photon excitation or three-photon excitation in the two-stage excitation method is employed in combination, the bit 360 where the beams are united becomes one picture element on the display surface. If electric fields which are excitation-power-modulated or pulse-width-modulated in response to a video input signal are applied to the radiation sources 353 and 354 and the addresses of the radiation sources are successively and selectively scanned, a continuous image can be displayed on the display surface.

If in this case the shape of the reflection point to which the beam is applied is round or rectangular, a dot-shaped or checks-shaped pattern can be obtained.

In addition, it goes without saying that if images based on the two-eye information are displayed on the fluorescent display surface 361 covered by a lenticular plate 362, a three-dimensional image display, or stereoscopic one, can be carried out according to the principle well-known.

Furthermore, if a fiber optics face plate is interposed between the display surface and a photosensitive recording material such as an electronic picture sheet or a printing paper of silver salt, and the photosensitive recording material is placed in contact with the face plate or is continuously moved, then the display image can be recorded directly. Alternatively, if a non-linear photosensitive recording material essentially including ZnO and Se sensing only the bit light of the beams united is employed, the image recording can be effected directly on the surface of the optical conductor without using the fluorescent display surface.

Figure 48A:
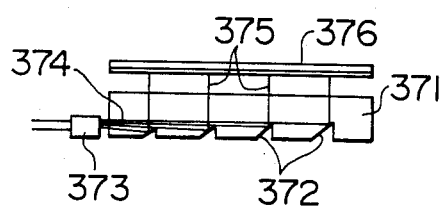
FIGS. 48(a) and (b) are sectional views showing modifications of the beam guide means.
Figure 48B:
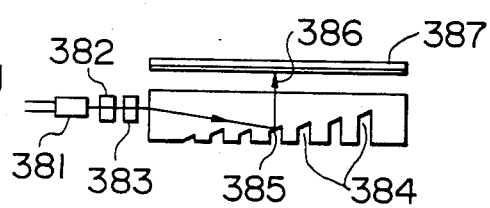
Figure 49:
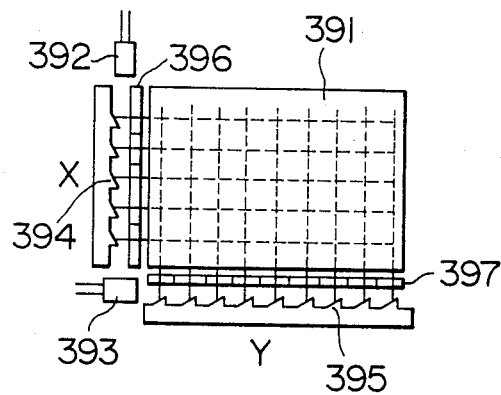
FIG. 49 is a plan view showing another example of the image display device according to the invention.

FIGS. 48 and 49 show the theoretical structures of other examples of the director. In FIG. 48(a), a flat optical conductor 371 made of transparent glass or plastic is employed as a beam transmitting medium, and mirror reflector lines 372 are provided on the bottom of optical conductor. When these reflector lines 372 is irradiated by beams 374 from a larger light source 373 provided on one side of the optical conductor, distribution beams 375 are formed and applied to a fluorescent display surface 376.

In FIG. 48(a), a beam from a beam radiation source 381 passes through a modulator 382 and a vertical deflector 383 so that it is applied to a predetermined one out of the reflector lines 384 arranged in the form of a staircase, and the beam 386 reflected by the reflective surface 385 forms a bright point representing one bit on a fluorescent display surface 387. In this example it is not always necessary to arrange the reflectors in the form of a staircase. The reflectors may be a series of concaved surfaces, which is more suitable for finely displaying an image.

Shown in FIG. 49 is another example of the image display device according to this invention, in which a matrix type optical conductor 391 is so designed that distribution beams are applied perpendicularly to a fluorescent display surface, that is, beams from light sources 392 and 393 which are provided respectively on the sides X and Y of the optical conductor irradiate reflector lines 394 and 394 thereby to provide distribution beams. In this case, if for instance shutters 396 and 397 such as a liquid crystal cell sandwiched between transparent electrodes of a pair are provided for the respective distribution beams as is shown in FIG. 49, a picture element representing one bit can be obtained on a fluorescent display surface. In other words, a distribution beam passes through one selected out of the windows of the shutter 396 while a distribution beam passes through one selected out of the windows of the shutter 397, and these beams are united, to represent one bit. The light source may be replaced by a series of many plasma discharge electrodes.

The beam described above is a visible or invisible light emitted continuously or intermittently including X-rays, infrared rays and ultraviolet rays. The same effects as those of this invention can be also attained by the use of electromagnetic waves such an electron beams, and especially by coherent laser beams.

Figure 50:
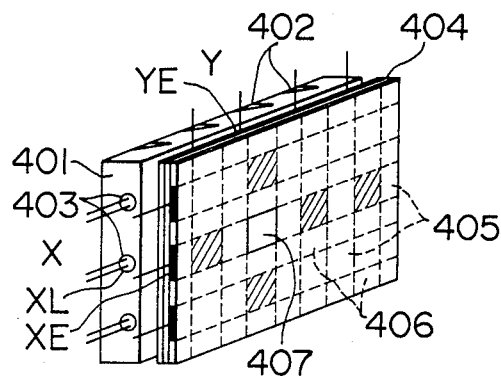
FIG. 50 is a perspective view illustrating an example of an image display device employing an electroluminescent matrix.

Shown in FIG. 50 is a light emitting device in which a plate-shaped transparent optical conductor 401 has four saw-tooth-like reflector lines 402 in parallel to the side X of the optical conductor, and three beams from three light sources 403 on the side X irradiate the slopes of the reflectors 402, and the beams reflected thereby cause the bits in the electro-luminescent (EL) matrix 404 having 12 (3 × 4) bits to emit light.

In the EL matrix 404, two groups of parallel transparent electrodes 405 and 406 intersect at right angles with each other, and a luminescent film obtained by mixing polycrystalline phosphorous or zinc sulfide and a rare earth metal ion fluorescent material is sandwiched therebetween.

It is assumed that electrodes XE and YE of the EL matrix are applied with electric fields and the bit at the intersection point 407 thereof emits light or is about to emit light. Under these conditions, when a light source XL is activated, distribution beams reflected by the reflector line 402 irradiate all of the bits on the electrode XE thereby causing the light emission. In this case, the intersection point 407 emits light by the two-stage excitation of the El electric field and the excitation light effecting a pumping action, but the other bits emit no light, or even if emitted, the light is invisible on the display surface.

The EL matrix may be modified for the same effect as follows. That is, no electrode terminals are provided at the side X, but lines of slit-shaped electrode pairs are provided only in the direction parallel to the side X, so that a point at which one selected out of the electrode pairs intersects a bit line of one beam light source, emits light. Thus, an image can be displayed by utilizing luminescent bits as picture elements.

Figure 51:
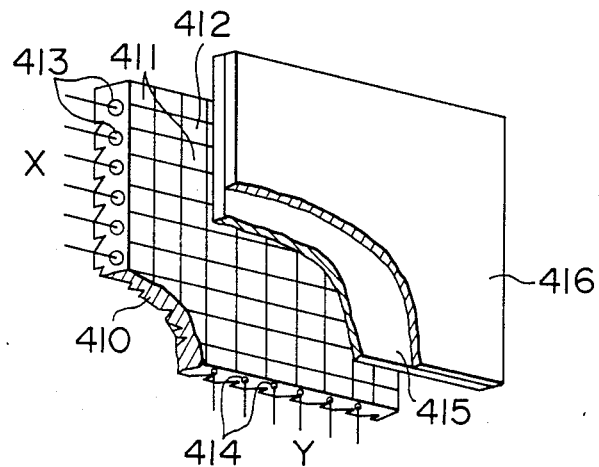
FIG. 51 is an exploded view showing another modification of the image display device.

Another example of the image display device according to the invention is illustrated in FIG. 51. In this example, as was described before, two groups of reflector lines 411 and 412 respectively in parallel to the sides X and Y of an optical conductor are perpendicular to each other on the bottom of the optical conductor 140, and light sources 413 and 414 are arranged on the sides X and Y, respectively, thereby forming one layer of a matrix type optical conductor. The device further comprises a fluorescent surface 415 provided above the optical conductor 410. Beams from the light sources are deflected by the reflector lines thereby forming distribution beam lines and columns. When these distribution beam lines and columns are intersected one another, the beams at the intersection points impinge on the fluorescent surface 415 so as to excite the latter to emit light. In FIG. 51, reference numeral 416 designates an image display panel. The edge lines of the reflector surfaces intersected perpendicularly are coated to prevent abnormal reflection.

Compounds containing rare earth metal ions which emits light through the two-stage excitation of infrared rays are preferable as the fluorescent material mentioned above. For instance, a fluorescent material made by adding ytterbium ions ($Yb^{3+}$) into the base material which has been obtained by adding holmium ions ($Ho^{3+}$) in calcium fluoride, can provide picture elements which emits green light upon application of infrared laser beams of the order of 9,600 A.

Figure 52:
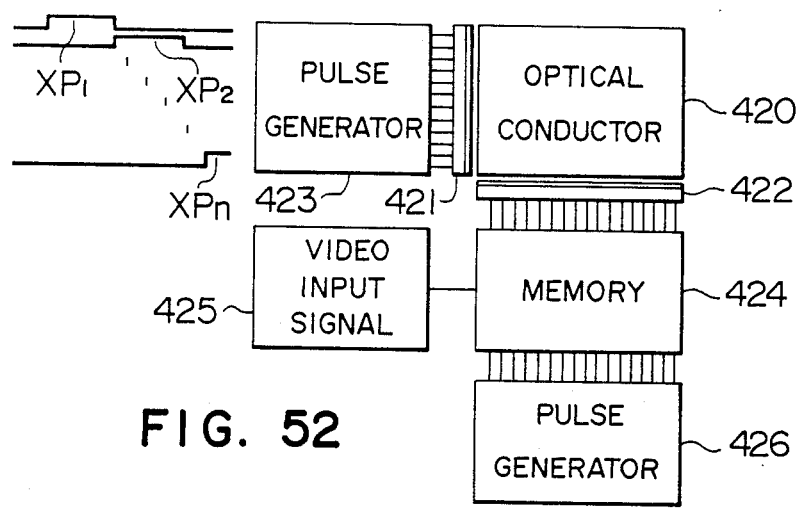
FIG. 52 is a wiring diagram for describing the input circuit and its operation of an image display device.

Accordingly, if as is shown in FIG. 52, signals from an X-axis pulse generator 423 and a Y-axis pulse generator 424 are applied to X-axis light sources 421 and Y-axis light sources 422 in a scanning mode, respectively, television image reception can be effected by the use of a matrix type optical conductor 420 having a fluorescent display surface. In this case one frame pulse $XP_1$ is applied to one of the X-axis light sources 421, while pulses $YP_1$ output-modulated in response to video input signals 425 are sequentially stored in a memory device 424. If, when the signals for one frame are obtained, they are applied to an optical conductor 420 simultaneously, it is possible to make the luminous periods of the picture elements as long as the waiting time with respect to the combination of the next pulses $XP_2$ and $YP_2$, which leads to the increase in brightness of the picture.

If each bit of the fluorescent surface is made of a dot-shaped or a strip-shaped three-color fluorescent material with the excitation energy or the wavelength of a joining beam being properly selected, a color image display can be effected as follows.

Figure 53:
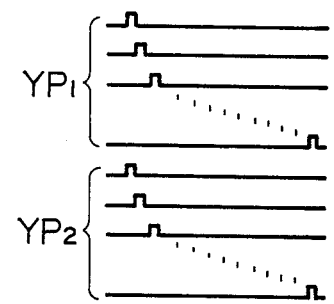
FIG. 53 is a diagram for describing the principle of a color display device.
Figure 53:
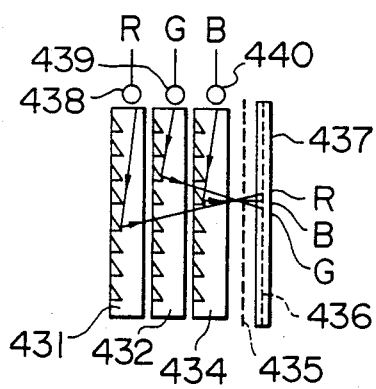

In an image display device shown in FIG. 53, there are provided three layers of matrix-type optical conductors 431, 432 and 433. This image display device further comprise a shadow mask 435 having apertures which is provided above the three optical conductors and a fluorescent display surface 437 provided above the shadow mask 435. The apertures are provided in correspondence to the beam paths for bits, for converging distribution beams. The fluorescent display surface 437 is coated with a three-color material in the form of dots.

The joining beams which have excitation wavelengths corresponding to three color fluorescent dots R, B and G and which are obtained by subjecting optical sources 438, 439 and 440 to excitation power modulation or excitation pulse width modulation with color signals and video input signals, are entered into the aperture having the address which has been selectively obtained by scanning the optical conductors. For instance, the joining distribution beam emitted from the optical conductor 431 advances as indicated by the arrow and impinges on the dot fluorescent material R to emit red light. The color signals in response to the video signal are thus applied to the light sources of the three-layer optical conductors successively, as a result of which a color image display as in the color television system can be carried out.

In addition to the fluorescent material described above, fluorescent materials obtained by adding, in combination, rare earth metal ions of ytterbium (Yb), erbium (Er) and the like can be employed as a fluorescent material which can emit color lights more effectively. A laser photo-diode of gallium-arsenic (GaAs) can be employed as the light source. If such fluorescent material described above are employed, various color phases such as green, red and blue can be emitted from one dot thereof by properly modulating the light sources. Accordingly, if the address selection is carried out at high speed, an image display device comprising one layer of matrix-type optical conductor can be provided.

In addition, a color image display can be also carried out by applying a lightness signal to one of the light source as in the present television image receiving system while obtaining joining beams corresponding to color difference signals from the other two layers. If the invention is employed in a color television image receiving circuit, its circuitry will be substantially the same as that in FIG. 44.

Various optical devices can be made in the above-described image display methods according to the invention. In this connection, if the density of the beam paths for conducting beams emitted from the light sources (or electro-magnetic wave emitting sources) is increased or if optical systems in the optical paths are scratched or distorted, it may be difficult to prevent the optical interference to the adjacent beams. Thus difficulty can be overcome by interposing a spacer having a small width and a different refractive index or a thin non-transparent spacer between the adjacent beam paths. It goes without saying that a plurality of optical conductors can be piled one on another directly or by interposing an air gap or a spacer having a different refractive index therebetween.

If plane surface mirrors or concaved mirrors are provided in contact with the end surface of the optical conductor where the light sources are installed and at the opposite end surface, the loss in light quantity can be reduced. A beam focusing lens system or a color filter may be interposed between the beam from the light source and the optical conductor. Instead of connecting the optical conductor directly to the light source, it may be connected through an optical fiber plate to the light source or an electrically scanning flying spot.

Furthermore, it is possible to provide a device in which a number of optical conductors different in the number of bits are piled one on another or a device in which an excitation beam having an optional configuration or bit distribution is externally applied to the distribution beams obtained by the optical conductors, thereby displaying points where these beams are joined.

For instance, personal or industrial image display devices, wall type television sets, video telephone sets, and large image display devices are obtained by the application of this invention. The invention is most effective in displaying large images, and is applicable to the manufacture of stereoscopic television sets and flexible display surface. Furthermore, the invention is applicable to display machines for electrically searching printing letters, and to image recording and transmitting devices such as home-facsimiles.

In addition, if visible lights having different wavelengths are employed as the light sources of the optical conductors, images can be directly displayed with distribution beams of various color. Therefore, the image display device of this invention can be realized as small display devices, large color-dimmer-type advertisement devices, or color lighting devices. Furthermore, if display light is applied directly to specified addresses, the display device can be utilized as a device for manufacturing a number of photosynthetic specimens. Thus, the application range of this invention is considerable wide and the devices utilizing the invention can be provided at low costs.

ASPECT VIII

An eighth aspect of this invention relates to optical memories comprising essentially optical conductors with reflector lines in which a number of optical information are selectively detected and processed by a photoelectric conversion system.

Known as input-out devices or memory units employing such a photoelectric conversion system are sequential access memories such as punched card readers, mark readers, and devices for reading characters and patterns as printing mediums, and random access read only laser hologram memories in which a hologram is employed as a memory medium and a reproduction real image obtained by laser beams is detected as the contents of a page. These devices are utilized as fixed memory systems or semi-fixed memory systems.

Furthermore, a memory device has been proposed in which a photochromic glass or a magnetic bubble is employed, and contents stored are rewritten or retained according to the presence and absence of beam transmission or beam reflection at memory points.

All of the conventional devices described above necessitate a number of light sources for irradiating the bits of the memory medium or a light source section for apply beam inputs from a few light sources to the bits, and carry out the information processing by the use of a beam receiving section in which the presence and absence of a beam input based on a memory pattern obtained when beams pass through the memory medium or are reflected thereby are subjected to photoelectric conversion with the aid of solar batteries, or photoelectric elements. However, in order to detect a large number of memory points at high speed, a series-parallel operation must be carried out by the use of a number of input light sources, and it is necessary for the beam receiving section to employ a sensor matrix, or a beam receiving element array, which is obtained by arranging on the whole surface of the beam receiving section semiconductor elements the number of which is equal to the number of the bits. Accordingly, the memory density is limited by the densities of the light sources and the beam receiving array. As a result, it is also limited to make the conventional optical memory smaller in size.

A method of arranging thin, fine optical fibers in a high density is also known. However, the construction of the optical memory in this case is considerably intricate, that is, whole construction of the optical memory necessarily becomes complicate, for instance, due to the wiring of the beam receiving elements and a circuit compensating for the scattering in performance of the same.

In addition, although an electromagnetic induction and a power loss is not so great as in a magnetic memory, the constructions of the light source section and the beam receiving section are greatly obstructive in the separation of the electrical input and output which is a problem peculiar to the optical memory, the realization of the high density matrix, and the simplification of the circuits.

This invention aims at the provision of a non-destructive read-out type optical memory in which all of the difficulties accompanying the conventional ones have been overcome. More specifically, an object of this invention is to provide a non-destructive read-out type semi-fixed optical memory having a relatively simple construction which is high in performance and density and is capable of rewriting data.

In the optical memory according to this invention, use is made of a matrix type memory medium which stores information in a two-dimensional structure of lines X and columns Y, and relatively flat optical conductors are provided for a light source section and a beam receiving section of the memory. The optical conductor is provided with reflective mirror lines each having a slope which has a saw-tooth-like, or uneven, or curved-surface-like part for serving as a reflector. In addition, spot light sources or beam receiving elements whose number is equal to that of bits in one line and in one column are provided on the sides of the optical conductor, while a memory medium is interposed between the light source optical conductor and the beam receiving optical conductor.

In the light source section, Ym pieces of spot light sources whose number is the same as that of memory lines are provided on the side of the light source optical conductor, and one spot light source selected out of them simultaneously irradiates the saw-tooth-shaped reflective surfaces positioned in correspondence to the bits of the line. The input beams are deflected through right angles by the reflective surfaces to irradiate the memory points, namely Xn pieces of bits, in the column selected of the memory medium.

The input beams which have passed through the information pattern on the memory medium are again deflected through right angles by a line of reflective surface in the beam receiving optical conductor so as to activate any one of the Xn pieces of beam receiving elements on the side of the beam receiving optical conductor. The bit information for one column thus selected can be detected from the presence and absence of outputs of the beam receiving elements. Therefore, if the light sources are turned on successively in a scanning mode and photoelectric outputs are detected in a paralled mode, the whole information of the memory medium can be read out.

Especially, in the beam receiving optical conductor, there is provided a parallel plane optical conductor plate made of a transparent material having a relatively great refractive index before the front surface, or the beam receiving surface, of the conductor plate. The input beam which has passed through the optical conductor plate substantially at right angles is reflected by a saw-tooth shaped reflective mirror surface and is introduced into the optical conductor plate again.

This incident beam advances in the optical conductor and irradiates a beam receiving element on the end thereof, or it advances repeating reflection and finally irradiates the beam receiving element.

If a transparent material such as a liquid having a different refractive index is interposed between the reflective mirror surface and the optical conductor plate, or if an optical conductor plate is additionally provided on the front surface of the rear surface of the former optical conductor plate, the beam path in the beam receiving section can be formed more effectively.

The optical memory comprising the light source optical conductor and the beam receiving optical conductor has been described. This optical memory can be modified in a manner such that a light source section selectively irradiates memory medium lines with which the beam receiving optical conductor is combined.

If in the optical memory an orthogonal slope is formed at each reflection point of the beam receiving optical conductor so that an incident beam is distributed or reflected in the directions X and Y, and the optical conductor is employed as a matrix type beam receiving section comprising beam receiving elements on the sides X and Y of the optical conductor, the effects of the optical memory described above can be attained.

Furthermore, the object of this invention can be achieved by a method of detecting the presence and absence or the intensity of the reflected beam in the same way as in the conventional mark reading device.

These optical memories operate on the principle of a fixed or semi-fixed memory. If a memory medium is employed which stores information in accordance with an optical or electromagnetic information writing system employing a photochromic glass, a magnetic film or a magnetic babble, a non-destructive memory device can be obtained.

An information rewriting optical conductor larger employing the photochromic glass as the memory medium is such as described below.

An optical conductor plate having reflective mirror columns whose number is equal to that of a predetermined lines similarly as in the optical conductor for the light source section, is so designed that incident beams from under the optical conductor plate pass therethrough upward substantially at right angles at the parallel plane part (other than the slopes) of the optical conductor plate. Two optical conductor plate thus formed are piled one on another with a slight air gap or a transparent spacer being interposed therebetween in such a manner that the groups of the reflector lines of the two plates are orthogonal. In addition, if it is assumed that a side of one optical conductive plate which reflected beams reach is a side X and that of the other optical conductor plate is a side Y, light sources of the order of 3,000 – 3,500 A for blackening the photochromic glass and laser light sources of the order of 6,500 – 7,000 A for clearing the same whose number is equal to that of bits required are provided on the sides X and Y.

If the photochromic glass is placed on the top of the special conductor layers and beams from the light sources on the sides X and Y are joined on the photochromic glass, the information at optional bits can be rewritten, that is, black points and clear points can be obtained.

If a light having a middle wavelength of the order of 5,000 – 5,500 A is employed as a reading optical source, the blackening and clearing operations are caused simultaneously, that is, a nondestructive read out operation can be carried out.

In this case, the intensity of the clearing light source is selected to be a ½ intensity so that only the combination of the beams from the light sources on the sides X and Y can provide a predetermined transparency. In addition, if the wavelength and intensity are selected so that the clearing operation is effected only when one light source excites the photochromic glass while the other light source irradiates the same and the beams from both of the light sources are joined together, the contrast ratio can be improved. It is preferable that the spot light diameter of the blackening light source is greater than that of the clearing light source.

At any rate, if the information rewriting optical conductor layer is interposed between the reading light source optical conductor and the beam receiving optical conductor, a non-destructive read-out optical memory can be obtained. It is also possible to provide the functions of the information rewriting optical conductor in either the light source optical conductor or the beam receiving optical conductor.

The beam receiving section of this invention is effective in detecting a large quantity of memory pattern such as in a laser hologram memory. If a laser beam is applied to a predetermined memory point of a plane memory hologram having a number of memory points each representing data in a page, the data in the memory point are reproduced as a real image on the real plane by the application of a reference beam. In this operation, if a slit type shutter which is adapted to pass only an incident beam in a column preselected is provided before the reading plane, this incident beam is detected by the beam receiving optical conductor. Accordingly, if the slits are successively and selectively scanned, the contents of the page can be read out according to the same principle as described before. In addition, the reproduction of the real image can be effected without using the slit type shutter. That is, if the reference beam is applied only to the column selected, the real image can be reproduced and accordingly the information of the page can be detected.

The information in the memory medium may be not only on numerals and characters, but also on pictures. The input beam may be any of the visible or invisible beams such as electromagnetic waves, X-rays, infrared rays, ultraviolet rays, and electron beams if elements for detecting them are provided.

Figure 54:
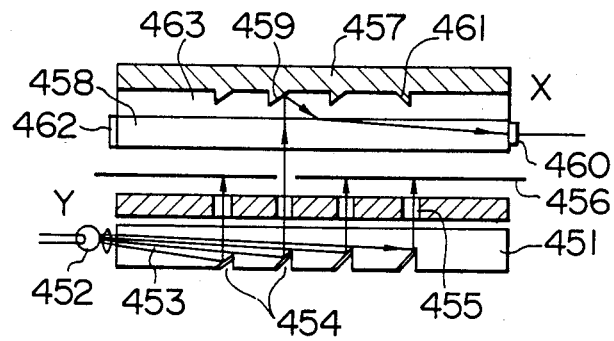
FIG. 54 is a sectional view illustrating a memory device according to the invention.
Figure 55:
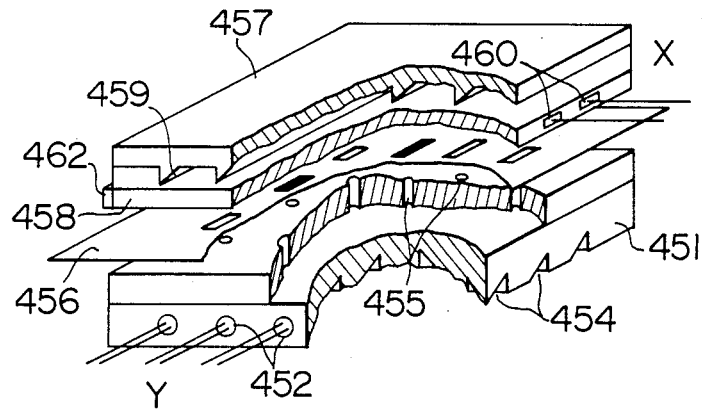
FIG. 55 is a perspective view, with parts cut, illustrating the structure of the memory device in FIG. 52.

One example of a - x - bit punched card reading device is shown in FIGS. 54 and 55, in which Y pieces of light sources -52 are arranged on the side Y of a plate-shaped optical conductor 451 made of a transparent acrylic resin. Input beams 453 are reflected by saw-tooth-shaped reflective mirror surfaces 454 on the bottom of the conductor 451 and reach a punched card 456 through an optical glass rod 455. The input beam passed through the card advances straightly as indicated by the arrow mark, and passes through an optical conductor plate 458 disposed before a beam receiving section 457. The beam is reflected by a reflective mirror surface 459 made of a metal again, and advances in the optical conductor plate 458 to irradiate a beam receiving element 460. In FIG. 54 illustrating a theoretical diagram of the device, the sections of the saw-tooth-shaped reflectors 454 and 459 in the form of Y columns in the light source optical conductor and in the form of X lines in the beam receiving optical conductor are shown. Two groups of the reflector lines 454 and 459 are perpendicular to each other as is illustrated in FIG. 55. Accordingly, upon activation of one of the light sources for the Y column, the light source irradiates the four reflective surfaces 455 to provide bit beams. In the beam receiving optical conductor, the bit beams are reflected by the respective reflector lines to reach four beam receiving elements provided on the side X, as a result of which four parallel output signals of "1" and/or "0" are produced. Therefore, if the light sources 452 are successively lighted on in a scanning mode and the resultant parallel output signals are read, the data on the punched card can be detected.

One reflective surface 461 located near the beam receiving element is opposite in inclination angle to the others in order that the reflected beam is entered into the optical conductor plate and is reflected again by a mirror surface 462 provided on the end of the optical conductor plate to irradiate the beam receiving element 460.

The provision of the glass rod 455 is not always necessary; however it serves to provide incident light in the form of beams so that the beams are applied to the punched card without mutual interference.

If a transparent liquid having a different refractive index is filled in the space 463 of the beam receiving optical conductor 457, it wil facilitate the reflection and transmission of the beam in the beam path 458 more effectively.

In the case where a high density memory such as a photographic film is employed as the memory medium, the light sources and the beam receiving elements should be placed at other positions in such a manner that they are connected through optical fiber means to the optical conductor.

Figure 56:
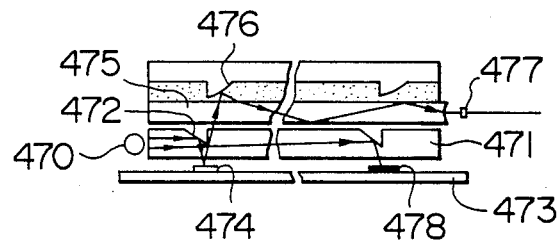
FIG. 56 is a sectional view of a card reading device according to the invention.

The case where the invention is applied to the mark reading device is illustrated in FIG. 56. A beam from a light source 470 is applied through a reflective surface 472 in an optical conductor 471 to a mark card 473. A beam reflected by a white mark having a greater refractive index, similarly as in the above-described example, passes through a beam receiving and focussing optical conductor plate 475. The beam thus passed is reflected by a reflective surface 476 to enter the optical conductor plate 475 again. The beam thus entered irradiates a beam receiving element 477 directly, or after repeating reflection and being focussed by a lens at the end of the optical conductor plate.

On the other hand, since the light quantity of reflection by a black mark is zero or a little, no predetermined output signal is produced by the beam receiving element 477. Accordingly, if the light sources and the beam receiving elements are operated in a scanning mode as was described with reference to FIG. 54, the information pattern on the mark card can be read.

The device having the light source optical conductor and the beam receiving optical conductor has been described. However, the effects of this device can be attained by modifying the device in such a manner that one of the optical conductors is provided with the light sources and the beam receiving elements at its ends.

Figure 57:
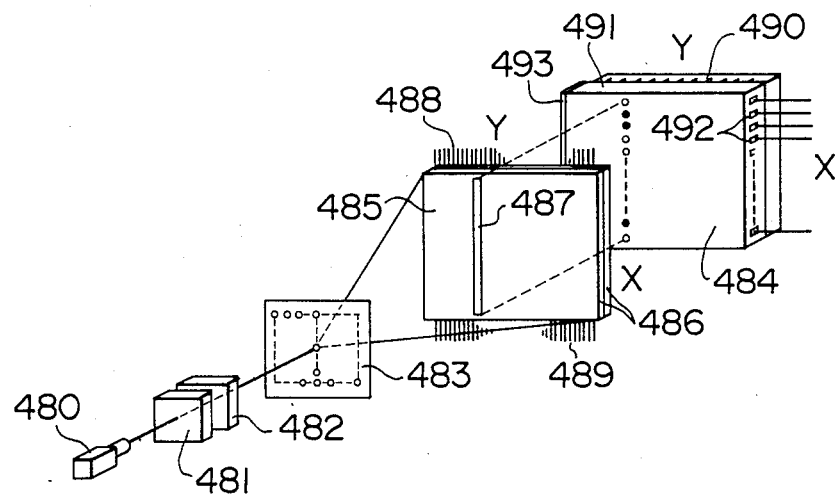
FIG. 57 is a perspective view showing a laser hologram memory according to the invention.

Shown in FIG. 57 is an optical memory according to the holography. In this optical memory, a laser beam from a light source 480 irradiates a predetermined memory point on a hologram memory plane 483 through an X-deflector 481 and a Y-deflector 482 of an address selection system. A real image of one memory point having the contents of one page is reproduced on a beam receiving optical conductor 484 by the use of a reference laser beam. A shutter 485 is provided in front of the reading surface 484. This shutter comprises a nematic liquid crystal 20 $\mu$ thick sandwiched by two parallel glass plates 486 and slit-shaped transparent opposed electrodes 487 which are disposed separately according to the column of matrix information.

A voltage of from several volts to several tens of volts is applied to the leads 488 and 489 of the opposed electrodes in advance so that the dynamic irregular reflection of the liquid crystal causes the shutter to be non-transparent. Under this condition, when the voltage of a designated address column is removed, only the opposite electrodes 487 corresponding to this address column becomes transparent. As a result, bit information in the Y-column thus selected is projected onto the optical conductor 484 by the laser beam. This optical conductor 484 is theoretically the same as that described before. Therefore, after having been reflected by a reflective surface 490, incident beams for the bits advance in a beam path 491 straightly to the beam receiving elements 492 on the side X thereof, or having been reflected by a mirror 493, they irradiate the beam receiving elements 492. Therefore, the presence or absence of the output is converted into an electrical signal as parallel memory information.

If the operation described above is successively carried out in a scanning mode for every column selected by the shutter 485, the contents of an information pattern for one page can be read out.

The liquid crystal which will become non-transparent upon application of a voltage has been described. However, a method of making transparent only the part to which a voltage is applied according to a cholesteric-nematic phase transition control system or a field effect torsion control system or other methods of causing a clear threshold phenomenon by improving a contrast ratio in light transmitivity can be effectively employed for improving the performance of the optical memory according to the invention.

For the selection of the slits in the Y-columns by the use of the shutter described above, there are various methods, that is, a mechanically operating method, an electromagnetic method utilizing a ferromagnetic film or a magnetic bubble, or an optical method using a photochromic glass. A proper one of these method can be employed according to the object in use of the optical memory. In addition, if the optical memory is so designed that it directly detects input beams such as object light by means of the beam receiving optical conductor, it can be utilized in light digital color cameras, image pickup devices or light pens.

Thus, the optical memory according to this invention is relatively simple in construction and is capable of achieving the processing of a large number of information at a low cost. Accordingly, the optical memory can be applied to not only main memory units, input-output devices or peripheral equipment, but also general purpose program type small electronic computers, credit collators, sensor matrixes in personal card identifiers, optical matrix switches, or other electromagnetic devices. Thus, the optical memory according to the invention can be applied to various electronic devices with the result of economy.

ASPECT IX

A ninth aspect of this invention directs to photoelectric converters in which a region to which a beam is applied is detected by an optical conductor comprising reflection beam paths and photoelectric elements.

Heretofore, the detection of an incident beam is carried out by a means by directly detecting the beam, in which means semiconductor photoelectric converter or photoelectric tubes are arranged on the whole beam receiving surface. However, in order to detect by this means what position the beam is applied to, the number of photoelectric elements, or the density in arrangement of the photoelectric elements, must be increased with the area of the beam receiving surface. Accordingly, the correction of the scatter in performance between the photoelectric elements and the processing of electrical signal are intricate, and the conventional means is therefore large in size and high in cost.

In addition, in a means for detecting the position of an incident beam by the combination of optical system such as lenses and half-mirrors (dichroic mirrors), the beam repeats transmission, refraction and reflection until it reaches a photoelectric element, and therefore the distance through which the beam passes is often long. Accordingly, the error in detecting the position of the incident beam is inevitably caused for instance by changing the advancing direction of the beam, and it is also limited to make the size of the means smaller.

An object of this invention is to provide a photoelectric observation device having a beam receiving section and a display section, in which a beam to be observed applied to a beam receiving surface shaped as desired is received by the surface of a relatively flat and plated-shaped optical conductor, is on one place in the optical conducter after being subjected to reflection and refraction in one of the beam path regions obtained by dividing the optical conductor, and is detected for an electrical signal by a photoelectric element provided at the beam concentrating section, and furthermore when a luminous material provided in the region receives the detection signal of the incident beam, it is turned on, whereby the beam incident position is continuously displayed on the beam receiving surface.

In other words, a very flat optical conductor is filled with a transparent semiconductor, gas or liquid having a relatively high refractive index, or is made of a transparent glass or acrylic resin. The front surface of this optical conductor serves as the beam receiving surface. Recesses or grooves are provided on the rear surface of the optical conductor so that the incident beam entered into the optical conductor is reflected by the recess. Thus, the incident beam is subjected to reflection and refraction in the optical conductor and finally reaches one predetermined point in the optical conductor, whereupon the arrival of the beam is detected by the photoelectric element provided at this point.

Accordingly, if the beam receiving surface is divided into several regions and each of the regions has one beam concentrating point, the detection of the beam incident point can be achieved by providing only one photoelectric element in each of the regions.

Another object in the ninth aspect of this invention is to meet the requirement for applying optional patterns or colors to the beam receiving surface of an ordinary received-beam detecting device employing photoelectric conversion. For instance, in the case where the beam receiving surface is employed as a target for a beam gun, the scoring regions of the target must be clearly seen by a marksman at a position remote from the target. For this purpose, it is preferable that similarly as in an ordinary target, the target is divided into several scoring regions by concentric circles, the central circule having the highest score being black, the circumferences of the other circles being black on a white background.

Accordingly, in one example of this invention, a beam absorbing layer is optionally colored according to a pattern drawn in advance and is placed on the rear side of an optional conductor so that the color can be seen through the beam receiving surface and the beams passing through the optical conductor are absorbed.

The term "beam" as herein used is intended to disignate a beam such as visible beams, laser beams, infrared rays, ultraviolet rays and X-rays, or a beam which can activate the photoelectric element.

Figure 58A:
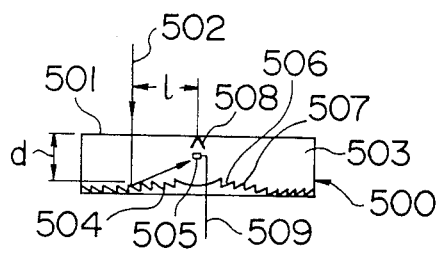
FIGS. 58(a) and (b) are schematic sectional and plan views showing a photoelectric transducer according to this invention, respectively.
Figure 58B:
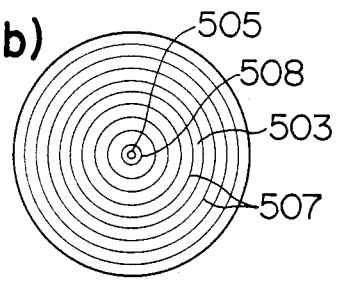

FIG. 58 is to illustrate the principle in the case where this invention is applied to the detection of the arrival of beams to be observed.

No matter where a spot beam 502 is applied on a beam receiving surface 501 of a flat optical conductor 500 made of an acrylic resin, the beam is reflected toward the center of the optical conductor by a sawtooth-shaped reflector section 504 provided on the bottom of the optical conductor, thereby to irradiate a small photo-transistor 505 suspended from the center part of the optical conductor. The reflector section is so designed that a beam path width $d$ increase with a beam path length $l$, and the inside surface of the reflection section is of a mirror. The beam 502 is reflected from a position near the top 507 of the reflective surface toward the photoelectric element 505 so as to be converted into an electric signal, which is taken out through a lead 509 connected to the element.

In general, only one side of the photoelectric element is a beam receiving surface. Therefore, in the device described above, only the reflected beams are detected by the element. Accordingly, if a beam having a very small diameter is directed to the element, it will impinge only on the rear side of the element. This disadvantage can be overcome by providing, for instance, a conical mirror 508 having a total reflection action.

If the reflective surface has such angle or curvature as to totally reflect incident beams, it is not always to give mirror-finish to the inside surface of the reflection section.

Figure 60:
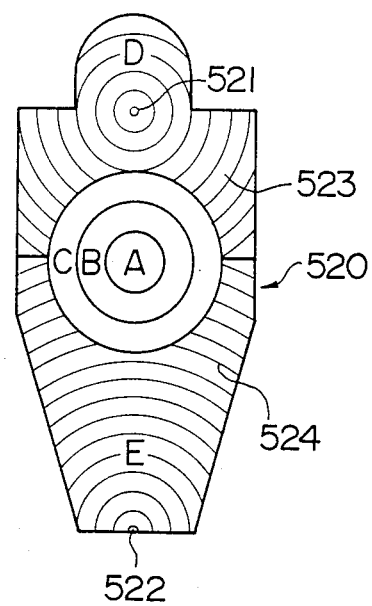
FIG. 60 is a plan view showing a target silhouette embodied according to the invention.
Figure 59A:
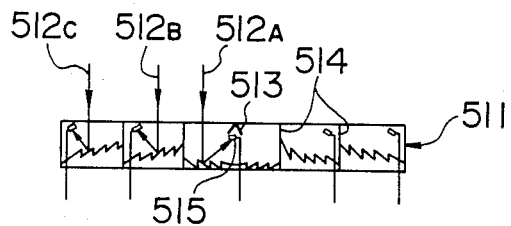
FIGS. 59(a) and (b) are also schematic sectional and plan views illustrating a photoelectric transducer employed as a target according to the invention, respectively.
Figure 59B:
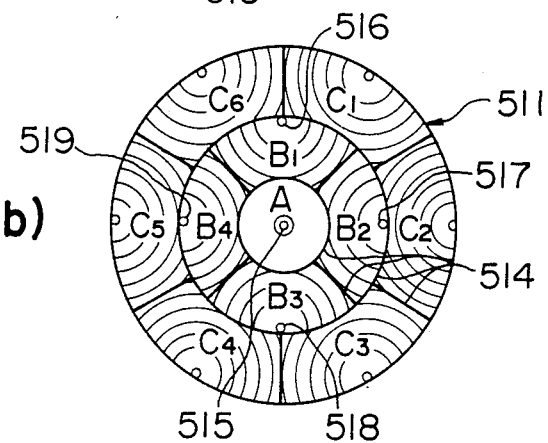

FIG. 59 shows one example of the case where this invention is applied to the target of a beam gun, in which an optical conductor 511 is made of an acrylic resin. In general, the target has several concentric circles which define scores and the central circle has the highest score. In this example, it is assumed that, as is shown in FIG. 60, the target comprises the central circle region A, an annular region B adjacent to the region A, and an annular region C just outside the region B, the regions B and C being divided into sections $B_1$, $B_2$, $B_3$ and $B_4$, and section $C_1$ through $C_6$, respectively. The regions and the sections are optically separated by an optically insulating material so that no optical leakage or interference is caused therebetween.

When a beam 512A is impinged on the region A, it is directed on a photoelectric element and is detected thereby as in the case of FIG. 58. When a beam 512B is impinged on the region B, it is necessary to detect what section in the region B has received the incident beam. This detection can be readily achieved because a photoelectric element is provided at a beam focussing section in each of the sections $B_1$ through $B_4$. An incident beam applied to the region C is also detected in the same manner.

Another example of the case where the invention is applied to a target is shown in FIG. 60, in which the optical conductor is made of a red acrylic resin for passing infrared rays therethrough, and a beam focussing point for receiving a reflected beam is provided for every scoring region and also for a reflection region. The detection of the beam applied to the scoring regions A, B and C is carried out in the same manner as described before. When beams are applied to regions D and E, they are concentrated on photoelectric elements 521 and 522 by mirror surfaces 523 and 524, thereby to be detected, respectively.

A modification of the photoelectric converter for the target is illustrated in FIG. 61, in which after passing through a target 532 indicating scoring regions by concentric circles 531, an incident beam 533 is reflected in an optical conductor 535 and is detected by a photoelectric element 53. A beam absorbing layer 536 is provided adjacent to the rear side of the optical conductor 535. Reference numeral 537 designates the housing of the target.

Similarly as in FIG. 59, the target is divided into two regions A and B, and the region B is further divided into four sections $B_1$, $B_2$, $B_3$ and $B_4$, and the regions and the sections are optically separated with an optical insulating material 538 so that no optical leakage or interference is caused. When the target is observed at a position remote therefrom, colors applied on the beam absorbing layer 536 can be seen because the target surface B and the optical conductor are made of a colorless transparent plastic. A cloth is stuck on the beam absorbing surface 536, so that the part 539 corresponding to the central region A is black and the annular region 540 just outside the black part is white. Thus, the target looks like the usual standard target.

No matter where in the target an incident beam is impinged, the beam thus impinged is reflected by a reflective surface 541 in the form of a saw-tooth-shaped groove provided on the rear surface of the round transparent optical conductor 533 and is advanced to the photoelectric element 534 provided in the section where the beam has been impinged, whereby the beam is converted into an electrical signal to detect where the beam has been applied. In FIG. 61, reference numeral 542 designates a light source for lighting the inside of the housing.

In addition, if in the case where a laser beam of far infrared rays is employed as the incident beam, the central region A is made with the compound plate of acrylic resin red plate and brown smoked plate, it is seen black by an optical illusion.

An example of the case where this invention is applied to a target photoelectric system having a beam detection section and a display section is shown in FIG. 62. In this example, a beam detection device 551 is a target of acrylic resin whose construction is substantially the same as that described with reference to FIG. 59. A reflection section on the rear surface of an optical conductor reflects a part of the incident beam but passes the other.

When a pulse beam 553 is momentarily applied to the beam receiving surface, or the target 552, a part of the pulse beam is reflected in the optical conductor, is converted into an electrical signal by a photoelectric element in the respective region, and is stored in a memory circuit 556 through a lead 554, while the other part passing through the optical conductor is applied to a second beam detector 557 which is provided at the rear of the optical conductor in such a manner that the optical axes are alined. This second beam detector is an optical conductor which acts in the same manner as that described with reference to FIG. 58, that is, it serves to convert an incident beam impinged on the beam receiving surface into an electrical signal. This electrical signal operates a control circuit 558, thereby to issue command signals to an address selection circuit 559 and a luminous material drive circuit 560.

Optical fibers 561 are connected to the regions of the first beam detector 551 so as to irradiate the respective regions or a reflection section 562 on the rear surface of the optical conductor, that is, the optical fibers serves to irradiate the target surface 552. The other ends of the optical fibers are connected through focussing lenses to display light sources 564.

When a single pulse beam 553 is detected by the first and second beam detector, the region or section of the target 552 to which the beam has been applied is detected as an address, while the light source 564 corresponding to his address emits light whereby the part corresponding to the position on the target surface to which the beam has been applied is continuously displayed by light through the optical fiber. Therefore the score obtained can be readily read.

In addition, the numerical display with respect to the beam incident position is effected on a score display board 566 through a digital count circuit 565.

If the light sources are made to emit different lights, the regions of the target can be distinguished by the color lights in the display. Further, it is possible to carry out the display by flickering light.

The reflective surface of the optical conductor of the beam detector 551 may be of a dichroic mirror (half-mirror), and the regions of the target may incorporate the light sources, respectively.

This invention can be applied to various devices such as automatic remote control type range finders or sight meters.

Thus, the photoelectric observation device according to this invention, unlike the conventional optical devices of this type, can process various incident beams by the optical conductor which is relatively small in size, optional in shape and simple in construction. Accordingly, the errors caused by the change in direction of beams and the aberration are extremely small in the device. Furthermore, the device is high in effeciency and low in cost.

In addition, in the beam receiving device according to this invention, it is possible to provide various patterns and colors on the beam absorbing layer. Various color displays according to the wavelengths of incident beams can be effected on the front and rear sides of the beam receiving optical conductor. Accordingly, this invention can be applied to various devices such as photoelectric input-output devices for display, targets and the like.

I claim:

1. An information processing optical device which comprises: a body having on a major surface thereof a number of discrete spot-like beam input sections arranged in the form of a matrix, and beam output sections in first and second groups with said groups arranged on separate end surfaces of the body in correspondence with the lines and columns of the spot-like beam input sections; beam guide means of a material different than said body provided in the body for each individually optically connecting corresponding individual beam input sections with both a corresponding one of the output sections in the first group and a corresponding one in the second group and including beam-dividing means comprising means having reflecting surfaces integral therewith for separating and independently transmitting individual beam input signals of radiant energy from the discrete, spot-like beam input sections in the lines and columns of said matrix to the beam output sections in the first and second groups as two independent beams representative of directions representative of X and Y directions for specifying the position of the corresponding individual input beams in X and Y coordinates; first and second optical encoders provided respectively in correspondence to the individual beam output sections in the first and second groups; and beam input terminals on the optical encoders optically connected to the respective beam output sections in the first and second groups.

2. An information processing optical device which comprises: a flat body having on a major surface thereof a number of spot-like beam output sections for taking out therefrom individual, independent output signals and arranged in the form of a matrix, first and second groups of beam input sections arranged on different end surfaces of the body in correspondence to the lines and columns of the beam output sections; beam guide means provided in the body each optically individually connecting individual beam input sections with a pair of output sections corresponding to one of the output sections in the first group and in the second group and including combining-means having reflecting surfaces integral therewith for transmitting to the corresponding pair of the spot-like beam output sections in the lines and columns separate, individual beam input signals of radiant energy each representative of two input beam signals of radiant energy from two respective corresponding beam input sections in the first group and the second group; first and second optical decoders provided respectively for the individual input sections of the first and second groups of said beam input sections; and beam output terminals of the first and second optical decoders optically connected respectively to corresponding, individual beam input sections of the first and second groups.

3. An information processing optical device comprising, a parallelepiped body having on a major surface thereof a first group of transparent sections arranged in a matrix, said body having a first edge surface on which a second group of transparent sections are arranged and a second edge surface on which a third group of transparent sections are arranged, beam-guide means in said body for transmitting beams of radiant energy and each optically connecting an individual transparent section of the first group to a corresponding transparent section of said second group and each optically connecting said individual transparent section of the first group to a corresponding transparent section of the third group separately from the second group, said beam-guide means including beam-dividing means integral therewith comprising reflecting surfaces for each receiving an input light beam incident on an individual corresponding transparent section of the first group and dividing it into two separate output beams perpendicular to each other and transmitting the two beams separately along a corresponding one of said beam-dividing means to a corresponding transparent section of the second group and a corresponding transparent section of the third group for emission therefrom as outputs, whereby the position of each input light beam may be specified by X and Y coordinates.

4. An information processing optical device comprising, a parallelepiped body having on a major surface thereof a first group of transparent sections arranged in a matrix, said body having a first edge surface on which a second group of transparent sections are arranged and a second edge surface on which a third group of transparent sections are arranged, beam-guide means in said body for transmitting beams of radiant energy and each optically connecting an individual transparent section of the first group to a corresponding transparent section of said second group and each optically connecting said individual transparent section of the first group to a corresponding transparent section of the third group separately from the second group, said guide means including means having reflecting surfaces for each receiving two input light beams one incident on an individual transparent section of said second group and another incident on individual transparent section of said third group transmitted through corresponding beam-guide means and transmitting them as a single beam output through the corresponding transparent section of the first group.

* * * * *